(12) United States Patent
Seo et al.

(10) Patent No.: US 12,112,690 B2
(45) Date of Patent: Oct. 8, 2024

(54) DATA DRIVER CONNECTED TO DATA LINES THROUGH FAN OUT LINES DISPOSED IN DISPLAY AREA, DISPLAY DEVICE INCLUDING DATA DRIVER, AND ELECTRONIC DEVICE INCLUDING DATA DRIVER

(71) Applicant: Samsung Display Co., Ltd., Yongin-Si (KR)

(72) Inventors: Hee-Jeong Seo, Yongin-si (KR); Woo-Chul Kim, Yongin-si (KR); Deok Jun Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/133,563

(22) Filed: Apr. 12, 2023

(65) Prior Publication Data
US 2024/0135862 A1 Apr. 25, 2024
US 2024/0233613 A9 Jul. 11, 2024

(30) Foreign Application Priority Data
Oct. 20, 2022 (KR) .................. 10-2022-0135643

(51) Int. Cl.
*G09G 3/32* (2016.01)

(52) U.S. Cl.
CPC ....... *G09G 3/32* (2013.01); *G09G 2310/0275* (2013.01); *G09G 2310/0291* (2013.01); *G09G 2310/08* (2013.01)

(58) Field of Classification Search
CPC ............. G09G 3/32; G09G 2310/0275; G09G 2310/0291; G09G 2310/08
See application file for complete search history.

(56) References Cited

U.S. PATENT DOCUMENTS

| 11,727,849 | B2 | 8/2023 | Lu et al. | |
| 2017/0077143 | A1 | 3/2017 | Lee et al. | |
| 2018/0174511 | A1* | 6/2018 | Kim | H10K 59/131 |
| 2020/0271979 | A1 | 8/2020 | Roh | |
| 2020/0312252 | A1* | 10/2020 | Jeong | G09G 3/3291 |
| 2020/0327834 | A1* | 10/2020 | Kim | G09G 3/006 |

(Continued)

FOREIGN PATENT DOCUMENTS

| KR | 10-1486038 B1 | 1/2015 |
| KR | 10-2018-0072303 A | 6/2018 |

(Continued)

*Primary Examiner* — Kwang-Su Yang
(74) *Attorney, Agent, or Firm* — Innovation Counsel LLP

(57) ABSTRACT

A display device includes first data lines including first color data lines connected to first sub-pixels, second color data lines connected to second sub-pixels, and third color data lines connected to third sub-pixels, and fan out lines including first fan out lines, second fan out lines alternately arranged with the first fan out lines in a peripheral region, and third fan out lines, a data driver outputting data voltages to the first fan out lines and the second fan out lines connected to the first data lines in a first arrangement according to the first arrangement, and output the data voltages to the third fan out lines connected to the first data lines in a second arrangement according to the second arrangement, and a timing controller remapping input image data based on the first arrangement.

20 Claims, 20 Drawing Sheets

(56) References Cited

U.S. PATENT DOCUMENTS

| | | | |
|---|---|---|---|
| 2020/0394967 A1 | 12/2020 | Park et al. | |
| 2021/0091164 A1* | 3/2021 | Kim | H10K 59/131 |
| 2022/0406854 A1 | 12/2022 | Choi et al. | |
| 2023/0306883 A1* | 9/2023 | Oh | H01L 27/124 |

FOREIGN PATENT DOCUMENTS

| | | |
|---|---|---|
| KR | 10-2019-0107258 A | 9/2019 |
| KR | 10-2023-0000531 A | 1/2023 |
| WO | 2021-158240 A1 | 8/2021 |
| WO | 2022-041945 A1 | 3/2022 |

* cited by examiner

DATA DRIVER CONNECTED TO DATA LINES THROUGH FAN OUT LINES DISPOSED IN DISPLAY AREA, DISPLAY DEVICE INCLUDING DATA DRIVER, AND ELECTRONIC DEVICE INCLUDING DATA DRIVER

PRIORITY STATEMENT

This application claims priority under 35 U.S.C. § 119 to Korean Patent Application No. 10-2022-0135643, filed on Oct. 20, 2022, in the Korean Intellectual Property Office KIPO, the contents of which are herein incorporated by reference in their entireties.

BACKGROUND

1. Field

Embodiments of the present inventive concept relate to a data driver, a display device having a data driver, and an electronic device having a data driver.

2. Description of the Related Art

Generally, a display device may include a display panel, a timing controller, gate driver, and a data driver. The display panel may include a plurality of gate lines, a plurality of data lines, and a plurality of pixels electrically connected to the gate lines and the data lines. The gate driver may provide gate signals to the gate lines. The data driver may provide data voltages to the data lines. The timing controller may control the gate driver and the data driver.

Each of the pixels may include a red sub-pixel displaying a red color, a green sub-pixel displaying a green color, and a blue sub-pixel displaying a blue color. The pixels may have various structures according to an arrangement of the red sub-pixels, the green sub-pixels, and the blue sub-pixels. For example, the pixels may have a stripe structure, a diamond pentile structure, and the like.

However, input image data input to the display device may not be input according to the structure of the pixels. Accordingly, the display device may need to remap the input image data according to the structure of pixels.

SUMMARY

Embodiments of the present inventive concept provide a data driver applying data voltages to fan out lines connected to data lines.

Embodiments of the present inventive concept also provide a display device having the data driver.

Embodiments of the present inventive concept also provide an electronic device having the data driver.

According to embodiments of the present inventive concept, a display device may include a display panel including sub-pixels including first sub-pixels configured to display a first color, second sub-pixels configured to display a second color, and third sub-pixels configured to display a third color, first data lines including first color data lines connected to the first sub-pixels, second color data lines connected to the second sub-pixels, and third color data lines connected to the third sub-pixels, a display region including a first display region, a second display region disposed adjacent to the first display region, and a third display region disposed adjacent to the second display region, fan out lines including first fan out lines connected to the first data lines connected to the sub-pixels disposed in the first display region, second fan out lines connected to the first data lines connected to the sub-pixels disposed in the second display region and alternately arranged with the first fan out lines in a peripheral region, and third fan out lines connected to the first data lines connected to the sub-pixels disposed in the third display region, a data driver configured to output data voltages to the first fan out lines and the second fan out lines connected to the first data lines in a first arrangement according to the first arrangement, and output data voltages to the third fan out lines connected to the first data lines in a second arrangement according to the second arrangement, and a timing controller configured to remap input image data based on the first arrangement and the second arrangement, and to control the data driver.

In an embodiment, at least one of the first color data lines and the third color data lines may be connected to sub-pixels disposed on a first side and a second side which opposes the first side of the at least one of the first color data lines and the third color data lines.

In an embodiment, the display panel may further include a second data line disposed adjacent to a first data line disposed on an outmost portion of the first data lines and connected to one of the first sub-pixels.

In an embodiment, each of the first data lines may be connected to sub-pixels disposed on the first side of the each of the first data lines.

In an embodiment, the fan out lines may further include a fourth fan out line connected to the second data line, and the data driver may include first output pads configured to output data voltages to the first fan out lines and the second fan out lines, and second output pads configured to output data voltages to the third fan out lines, and first dummy pads disposed between the first output pads and the second output pads.

In an embodiment, one of the first dummy pads determined according to the first arrangement may be configured to output a data voltage to the fourth fan out line.

In an embodiment, a number of the first dummy pads may be a number of colors constituting the first arrangement.

In an embodiment, one of the first dummy pads determined according to the second arrangement may be configured to output a data voltage to the fourth fan out line.

In an embodiment, a number of first dummy pads may be the same as a number of sub-pixels constituting the second arrangement.

In an embodiment, the fourth fan out line may be disposed adjacent to the third fan out line disposed adjacent to the second display region.

In an embodiment, the first dummy pads may be disposed between the second output pads and a first output pads disposed on a first side of the display region, and the data driver may further include second dummy pads disposed between the second output pads and a first output pads disposed on a second side of the display region.

In an embodiment, the data driver may further include output amplifiers respectively connected to output pads among the first output pads, the second output pads, and the first dummy pads.

In an embodiment, the data driver may further include output amplifiers respectively connected to at least two of output pads among the first output pads, the second output pads, and the first dummy pads.

According to embodiments of the present inventive concept, a data driver for outputting data voltages to a display panel which includes first data lines including first color data lines connected to first sub-pixels configured to display a first color, second color data lines connected to second sub-pixels configured to display a second color, and third color data lines connected to third sub-pixels configured to display a third color, and fan out lines including first fan out lines connected to the first data lines connected to sub-pixels disposed on a first display region of the display panel, second fan out lines connected to the first data lines connected to the sub-pixels disposed on a second display region of the display panel disposed adjacent to the first display region, and third fan out lines connected to the first data lines connected to the sub-pixels disposed on a third display region of the display panel disposed adjacent to the second display region, the data driver may include first output pads configured to output data voltages to the first fan-out lines and the second fan-out lines connected to respective first data lines in a first arrangement according to the first arrangement, and second output pads configured to output data voltages to the third fan out lines connected to respective first data lines in a second arrangement according to the second arrangement.

In an embodiment, the data driver may further include a first dummy pads, and one of the first dummy pads determined according to the first arrangement may be configured to output a data voltage to a fourth fan out line connected to a second data line which is disposed outside of the first data lines and connected to one of the first sub-pixels.

In an embodiment, a number of the first dummy pads may be the same as a number of sub-pixels constituting the first arrangement.

According to embodiments of the present inventive concept, an electronic device may include a display module, a main processor configured to output input image data to the sub processor, and a sub processor configured to control the display module, the display module may include a display panel including sub-pixels which includes first sub-pixels configured to display a first color, second sub-pixels configured to display a second color, and third sub-pixels configured to display a third color, first data lines including first color data lines connected to the first sub-pixels, second color data lines connected to the second sub-pixels, and third color data lines connected to the third sub-pixels, a display region including a first display region, a second display region disposed adjacent to the first display region, and a third display region disposed adjacent to the second display region, and fan out lines including first fan out lines connected to the first data lines connected to the sub-pixels disposed in the first display region, second fan out lines connected to the first data lines connected to the sub-pixels disposed in the second display region and alternately arranged with the first fan out lines in a peripheral region, and third fan out lines connected to the first data lines connected to the sub-pixels disposed in the third display region, and a data driver configured to output data voltages to the first fan out lines and the second fan out lines connected to the first data lines in a first arrangement according to the first arrangement, and output data voltages to the third fan out lines connected to the first data lines in a second arrangement according to the second arrangement. The sub processor may be configured to remap the input image data based on the first arrangement and the second arrangement.

In an embodiment, at least one of the first color data lines and the third color data lines may be connected to sub-pixels disposed on a first side and a second side which opposes the first side of the at least one of the first color data lines and the third color data lines.

In an embodiment, the display panel may further include a second data line disposed adjacent to a first data line disposed on outmost portion of the first data lines and connected to one of the first sub-pixels.

In an embodiment, the fan out lines may further include a fourth fan out line connected to the second data line, the data driver may include first output pads configured to output data voltages to the first fan out lines and the second fan out lines, and second output pads configured to output data voltages to the third fan out lines, and first dummy pads disposed between the first output pads and the second output pads. One of the first dummy pads determined according to the first arrangement may be configured to output a data voltage to the fourth fan out line.

Therefore, the display device may connect one data line to sub-pixels for one color by including first color data lines connected to first sub-pixels displaying a first color, second color data lines connected to second sub-pixels displaying a second color, and third color data lines connected to third sub-pixels displaying a third color. Accordingly, the display device may reduce power consumption compared to a conventional display device in which one data line is connected to sub-pixels for a plurality of colors.

In addition, the display device may reduce a dead space (i.e., a peripheral region) of a display panel by connecting first fan out line lines to a first data line connected to sub-pixels disposed on a first display region via a display region of the display panel.

Further, the display device may remap input image data according to a structure of pixels and an arrangement of data lines and fan-out lines by remapping the input image data according to a first arrangement and a second arrangement.

And, the data driver may appropriately output data voltages according to a structure of pixels and an arrangement of data lines and fan-out lines by including dummy pads.

However, the effects of the present inventive concept are not limited to the above-described effects, and may be variously expanded without departing from the spirit and scope of the present inventive concept.

DETAILED DESCRIPTION OF THE INVENTIVE CONCEPT

Hereinafter, the present inventive concept will be explained in detail with reference to the accompanying drawings.

Figure 1:
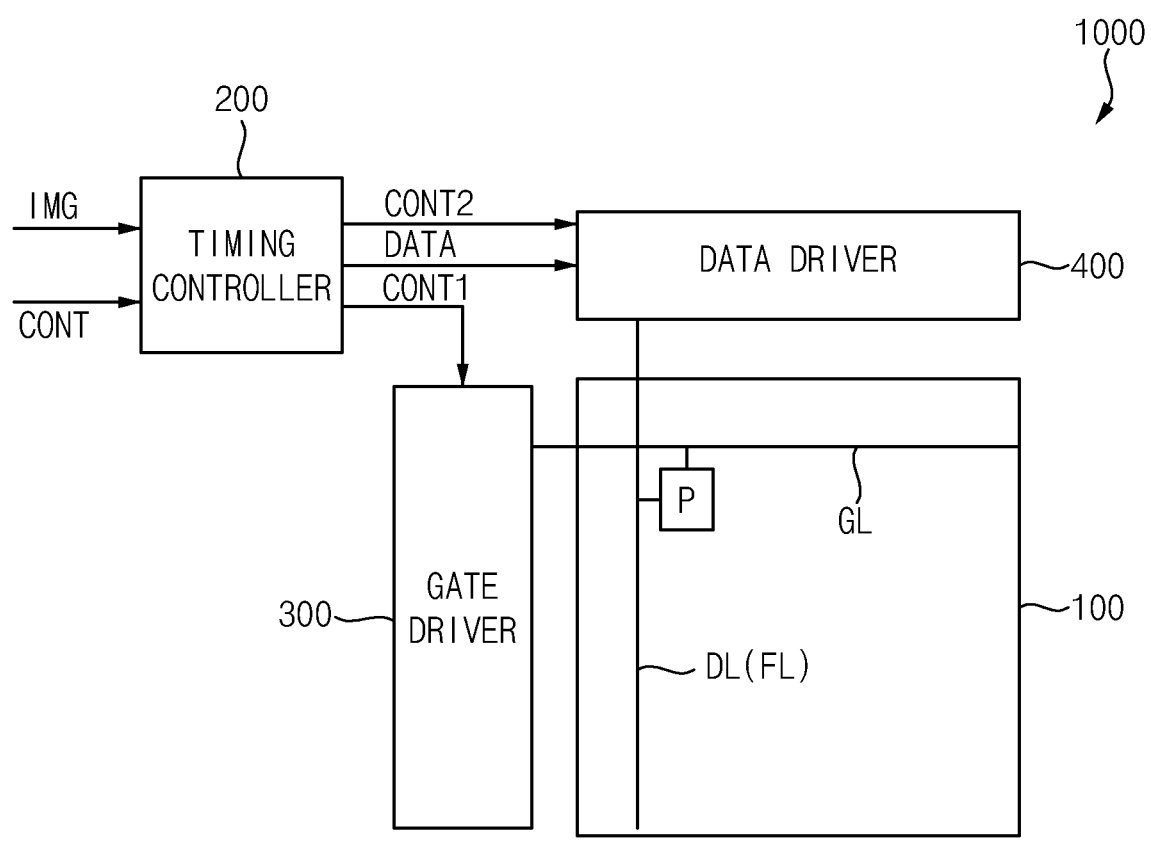
FIG. 1 is a block diagram illustrating a display device according to embodiments of the present inventive concept.

FIG. 1 is a block diagram illustrating a display device according to embodiments of the present inventive concept.

Referring to FIG. 1, the display device may include a display panel 100, a timing controller 200, a gate driver 300, and a data driver 400. In an embodiment, the timing controller 200 and the data driver 400 may be integrated into one chip.

The display panel 100 has a display region AA on which an image is displayed and a peripheral region PA disposed adjacent to the display region AA. In an embodiment, the gate driver 300 may be mounted on the peripheral region PA of the display panel 100.

The display panel 100 may include a plurality of gate lines GL, a plurality of data lines DL, and a plurality of pixels P electrically connected to the data lines DL and the gate lines GL. The gate lines GL and the data lines DL may extend in directions crossing each other.

The timing controller 200 may receive input image data IMG and an input control signal CONT from a host processor (e.g., a graphic processing unit; GPU). For example, the input image data IMG may include red image data, green image data and blue image data. In an embodiment, the input image data IMG may further include white image data. For another example, the input image data IMG may further include magenta image data, yellow image data, and cyan image data. The input control signal CONT may include a master clock signal and a data enable signal. The input control signal CONT may further include a vertical synchronizing signal and a horizontal synchronizing signal.

The timing controller 200 may generate a first control signal CONT1, a second control signal CONT2, and data signal DATA based on the input image data IMG and the input control signal CONT.

The timing controller 200 may generate the first control signal CONT1 for controlling operation of the gate driver 300 based on the input control signal CONT and output the first control signal CONT1 to the gate driver 300. The first control signal CONT1 may include a vertical start signal and a gate clock signal.

The timing controller 200 may generate the second control signal CONT2 for controlling operation of the data driver 400 based on the input control signal CONT and output the second control signal CONT2 to the data driver 400. The second control signal CONT2 may include a horizontal start signal and a load signal.

The timing controller 200 may receive the input image data IMG and the input control signal CONT, and generate the data signal DATA. The timing controller 200 may output the data signal DATA to the data driver 400.

The gate driver 300 may generate gate signals for driving the gate lines GL in response to the first control signal CONT1 input from the timing controller 200. The gate driver 300 may output the gate signals to the gate lines GL. For example, the gate driver 300 may sequentially output the gate signals to the gate lines GL.

The data driver 400 may receive the second control signal CONT2 and the data signal DATA from the timing controller 200. The data driver 400 may convert the data signal DATA into data voltages having an analog type. The data driver 400 may output the data voltages to the data lines DL.

Figure 2:
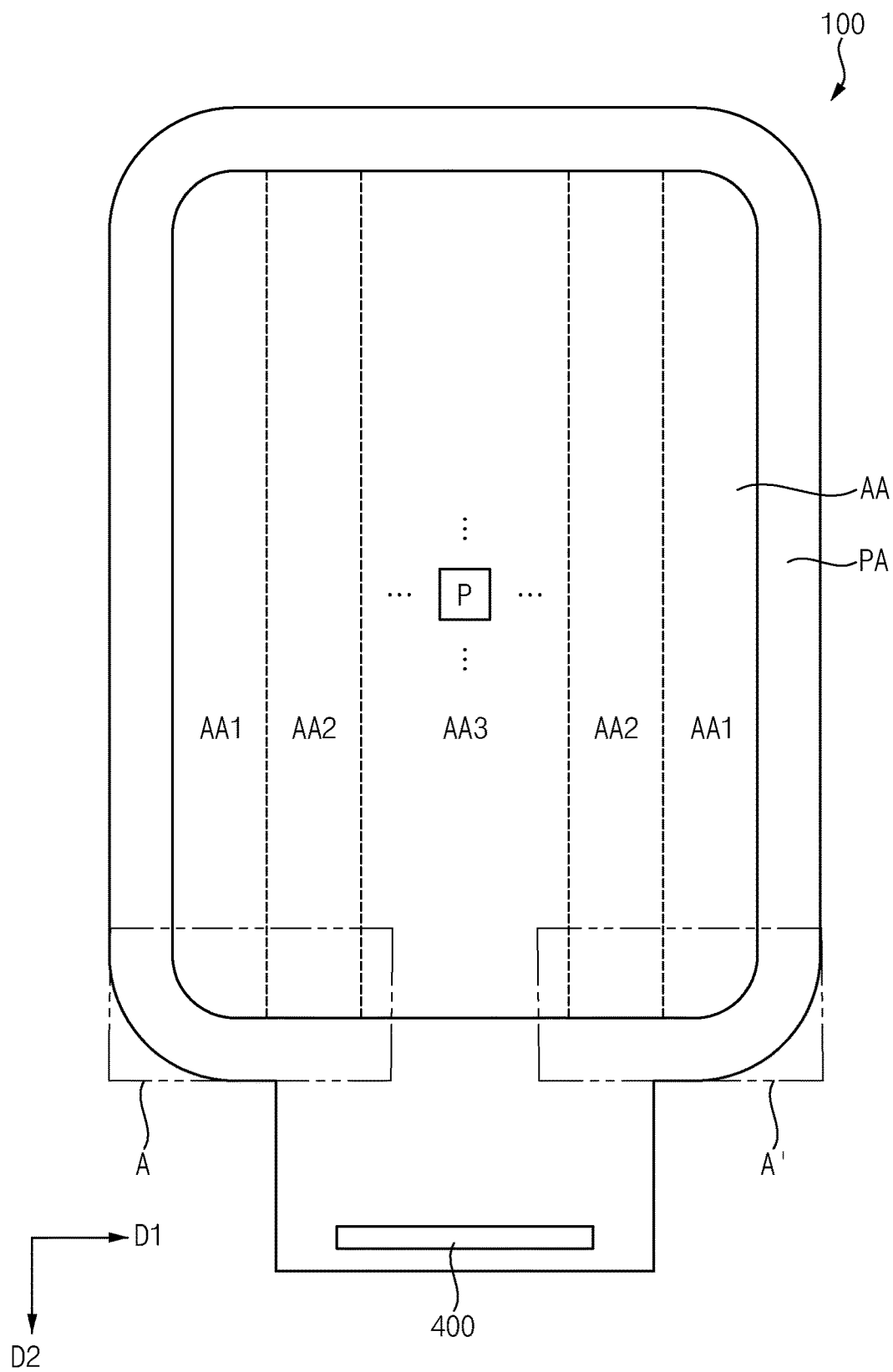
FIG. 2 is a diagram illustrating an example of a display panel of the display device of FIG. 1.
Figure 3:
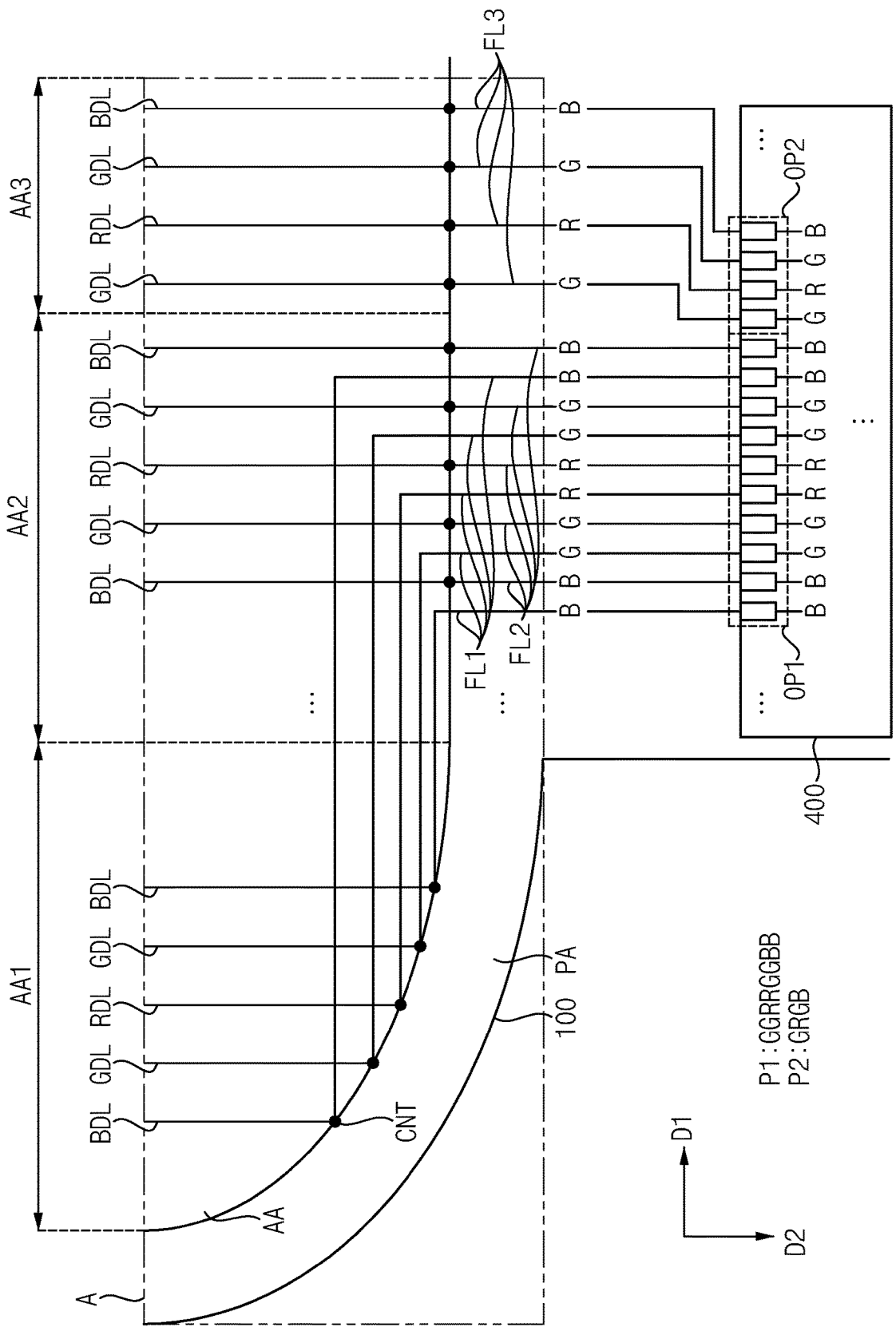
FIG. 3 is a diagram illustrating an example of an area A of FIG. 2 and a data driver of the display device of FIG. 1.
Figure 4:
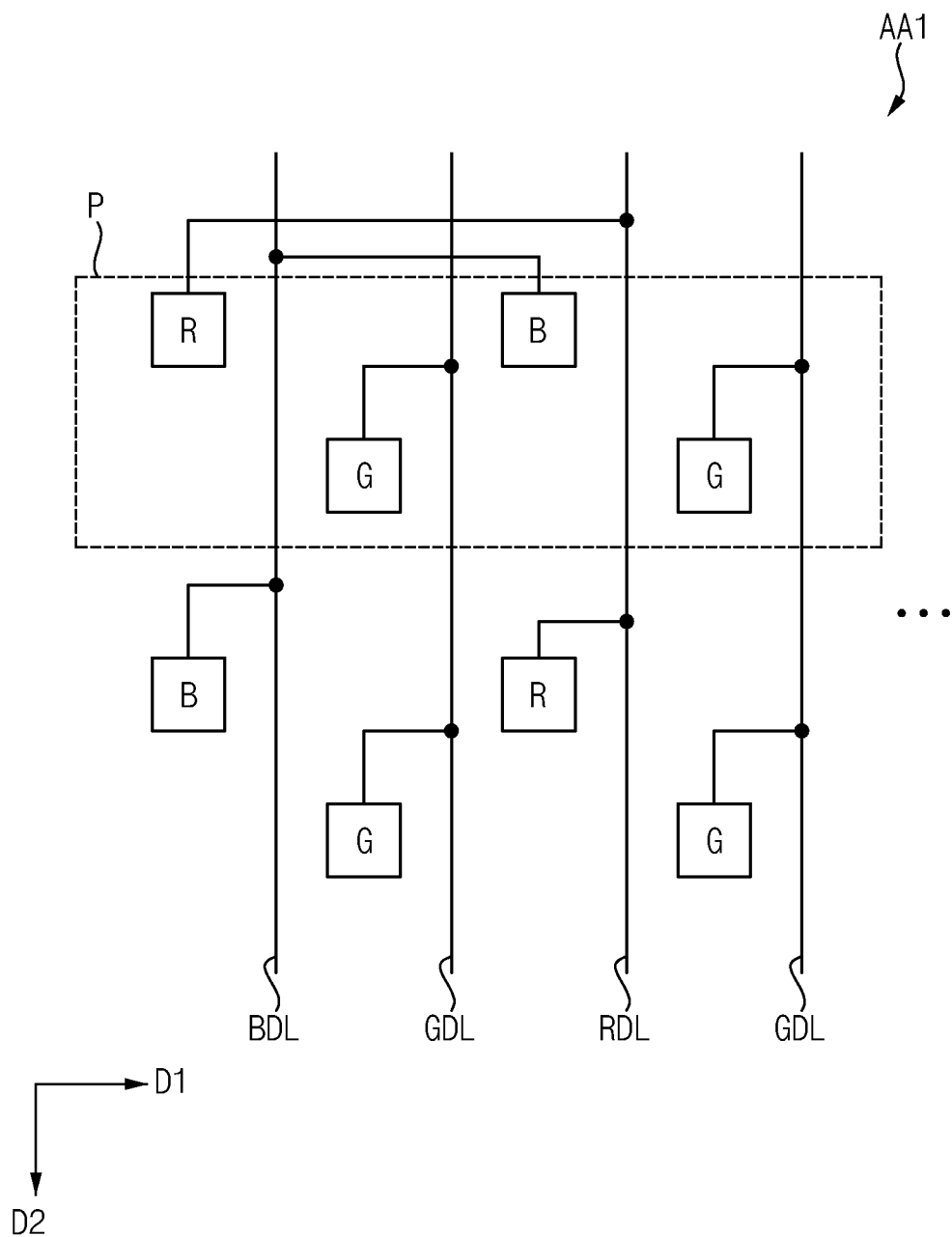
FIG. 4 is a diagram illustrating an example of sub-pixels disposed on a first display region adjacent to a second display region of the display device of FIG. 1 in a direction opposite to a first direction.

FIG. 2 is a diagram illustrating an example of the display panel 100 of the display device of FIG. 1, FIG. 3 is a diagram illustrating an example of an area A of FIG. 2 and the data driver 400 of the display device of FIG. 1, and FIG. 4 is a diagram illustrating an example of sub-pixels disposed on a first display region AA1 adjacent to a second display region AA2 of the display device of FIG. 1 in a direction opposite to a first direction D1. FIG. 3 shows that the data driver 400 is disposed adjacent to the display panel 100 in a second direction D2.

Referring to FIGS. 1 to 4, the data driver 400 may be mounted on the peripheral region PA. The data driver 400 may be implemented as a driver driving chip. In an embodiment, the driver driving chip and the timing controller 200 may form one integrated chip.

The display region AA may include the first display region AA1, the second display region AA2 disposed adjacent to the first display region AA1 along a first direction, and a third display region AA3 disposed adjacent to the second display region AA2 along the first direction.

For example, the first display region AA1 may include an edge region of the display region AA. The edge region of the display region AA may have a curved shape.

Each of the pixels P may include the sub-pixels. The sub-pixels may include first sub-pixels displaying a first color R, second sub-pixels displaying a second color G, and third sub-pixels displaying a third color B.

For example, as shown in FIG. 4, each of the pixels P may have an RGBG structure including one first sub-pixel, two second sub-pixels, and one third sub-pixel. However, the present inventive concept is not limited thereto.

The display panel 100 may include first color data lines RDL connected to the first sub-pixels, second color data lines GDL connected to the second sub-pixels, and third color data lines BDL connected to the third sub-pixels. That is, one data line may be connected to one sub-pixels which represents one color.

For example, only first sub-pixels displaying the first color R may be connected to the first color data lines RDL. Only second sub-pixels displaying the second color G may be connected to the second color data lines GDL. Only third sub-pixels displaying the third color (B) may be connected to the third color data lines BDL.

Accordingly, the display device may reduce power consumption compared to a display device which includes one data line connected to sub-pixels displaying a plurality of colors.

In an embodiment, at least one of the first color data lines RDL and the third color data lines BDL may be connected to sub-pixels disposed in different columns and emitting the same color of light.

For example, as shown in FIG. 4, the third color data line BDL may be connected to the sub-pixel displaying the third color B in different columns, for example, in a first column and a third column. However, the present invention is not limited thereto.

Fan out lines FL may be arranged on the peripheral region PA of the display panel 100. The fan out lines FL include first fan out lines FL1 connected to first data lines RDL, GDL, and BDL connected to the sub-pixels disposed on the first display region AA1, second fan out lines FL2 connected to the first data lines RDL, GDL, and BDL connected to the sub-pixels disposed on the second display region AA2 and alternately arranged with the first fan out lines FL1 in the peripheral region PA, and third fan out lines FL3 connected to the first data lines RDL, GDL, and BDL connected to the sub-pixels disposed on the third display region AA3.

Although FIG. 3 shows that the first fan out lines FL1 and the second fan out lines FL2 are alternately arranged one by one, the present inventive concept is not limited thereto. For example, the first fan out lines FL1 and the second fan out lines FL2 may be alternately arranged in two or more lines.

The first data lines RDL, GDL, and BDL may extend in the second direction D2 in the display region AA of the display panel 100. The fan out lines FL may be connected to the first data lines RDL, GDL, and BDL.

For example, as shown in FIG. 3, the first fan out lines FL1 may be connected to the first data lines RDL, GDL, and BDL via the display region AA and the peripheral region PA. That is, the first fan out lines FL1 may be disposed on the display region AA and the peripheral region PA.

The first fan out lines FL1 and the first data lines RDL, GDL, and BDL disposed in the first display region AA1 may be disposed on different layers. The first fan out lines FL1 and the first data lines RDL, GDL, and BDL disposed in the first display region AA1 may contact each other through a contact hole CNT.

For example, as shown in FIG. 3, the second fan out lines FL2 and the third fan out lines FL3 may be connected to the first data lines RDL, GDL, and BDL disposed in the second display area AA2 and the third display areas, respectively, via the peripheral region PA.

The second fan out lines FL2 and the first data lines RDL, GDL, and BDL disposed in the second display region AA2 may be disposed on different layers. The second fan out lines FL2 and the first data lines RDL, GDL, and BDL disposed in the second display region AA2 may contact each other through the contact hole CNT.

The third fan out lines FL3 and the first data lines RDL, GDL, and BDL disposed in the third display region AA3 may be disposed on different layers. The third fan out lines FL3 and the first data lines RDL, GDL, and BDL may disposed in the third display region AA3 contact each other through the contact hole CNT.

In this way, the display device may reduce a dead space (i.e., the peripheral region PA) of the display panel 100 by connecting the first fan out line lines FL1 to the first data lines RDL, GDL, and BDL connected to the sub-pixels disposed in the first display region AA1 via the display region AA of the display panel 100.

The data driver 400 may output the data voltages to the first fan out lines FL1 and the second fan out lines FL2 connected to the first data lines RDL, GDL, and BDL in a first arrangement P1 according to the first arrangement P1, and output the data voltages to the third fan out lines FL3 connected to the first data lines RDL, GDL, and BDL in a second arrangement P2 according to the second arrangement P2 which is different from the first arrangement P1. The timing controller 200 may remap the input image data IMG based on the first arrangement P1 and the second arrangement P2.

For example, the first and second fan out lines FL1 and FL2 may be repeatedly connected to the first data lines RDL, GDL, and BDL in the first arrangement P1. For example, the third fan out lines FL3 may be repeatedly connected to the first data lines RDL, GDL, and BDL in the second arrangement P2.

For example, when the first arrangement P1 is GGRRGGBB, the first fan out lines FL1 and the second fan out lines FL2 may be repeatedly connected to the first data lines RDL, GDL, and BDL in order of two second color data lines GDL, two first color data lines RDL, two second color data lines GDL, and two third color data lines BDL.

As described above, since the first fan out lines FL1 and the first data lines RDL, GDL, and BDL are disposed on different layers and the first fan out lines FL1 are connected to the first data lines RDL, GDL, and BDL via the display region AA, the first fan out lines FL1 and the second fan out lines FL1 may be alternately arranged and may cross the first data lines RDL, GDL, and BDL in the display region RR. Accordingly, although the sub-pixels have the RGBG structure, the first arrangement P1 may be composed of 8 colors of GGRRGGBB. Here, 8 colors do not mean 8 kinds of colors.

In this embodiment, the first arrangement P1 is exemplified as GGRRGGBB, but the present inventive concept is not limited thereto.

For example, when the second arrangement P2 is GRGB, the third fan out lines FL3 may be repeatedly connected to the first data lines RDL, GDL, and BDL in order of the second color data line GDL, the first color data line RDL, the second color data line GDL, and the third color data line BDL. In this embodiment, the second arrangement P2 is exemplified as GRGB, but the present inventive concept is not limited thereto.

The data driver 400 may include first output pads OP1 outputting the data voltages to the first fan out lines FL1 and the second fan out lines FL2, and second output pads OP2 outputting the data voltages to the third fan out lines FL3. The data driver 400 may output the data voltages to the fan out lines FL through the output pads OP1 and OP2.

For example, when the data voltage for the first color R is input to the output pads OP1 and OP2, the output pads OP1 and OP2 may output the data voltages for the first color R to the fan out lines FL. When the data voltage for the second color G is input to the output pads OP1 and OP2, the output pads OP1 and OP2 may output the data voltages for the second color G to the fan out lines FL. When the data voltage for the third color B is input to the output pads OP1 and OP2, the output pads OP1 and OP2 may output the data voltages for the third color B to the fan out lines FL.

The timing controller 200 may output the data signal DATA generated by remapping the input image data IMG to the data driver 400. The data driver may output the data voltages based on the remapped data signal DATA. Accordingly, the data driver 400 may output the data voltages according to a structure of the pixels P and an arrangement of the data lines DL and fan out lines FL.

The timing controller 200 may adjust colors represented by the data voltages output from the data driver 400 by remapping the input image data IMG. In an embodiment, the timing controller 200 may adjust an order of the data voltages output from the data driver 400 by remapping the input image data IMG.

The data driver 400 may repeatedly output the data voltages to the first fan out lines FL1 and the second fan-out lines FL2 according to the first arrangement P1, and repeatedly output the data voltages to the third fan-out lines FL3 according to the second arrangement P2.

For example, as shown in FIG. 3, the first arrangement P1 may be GGRRGGBB. That is, the data driver 400 may output the data voltages to the first fan out lines FL1 and the second fan out lines Fl2 in the order of GGRRGGBB of along the first direction D1. That is, the first fan out lines FL1 and the second fan out lines FL2 may sequentially receive data voltages in the order of GRGB.

For example, as shown in FIG. 3, the first fan out lines FL1 and the second fan out lines FL2 are connected to the first data lines RDL, GDL, and BDL in the order of GDL, GDL, RDL, RDL, GDL, GDL, BDL, and BDL, and the data driver 400 may output the data voltages corresponding to order of the second color G, the second color G, the first color R, the first color R, the second color G, the second color G, the third color B, and the third color B along the first direction D1.

For example, the first fan out lines FL1 and the second fan out lines FL2 may be connected to two first color data lines RDL and then to two second color data lines GDL. The first fan out lines FL1 and the second fan out lines FL2 may be connected to two third color data lines BDL and then to two second color data lines GDL. The first fan out lines FL1 and the second fan out lines FL2 may be connected to two second color data lines GDL and then to two first color data lines RDL or two third color data lines BDL.

For example, as shown in FIG. 3, the second arrangement P2 may be GRGB. That is, the third fan out lines FL3 may be connected to the first data lines RDL, GDL, and BDL in the order of GRGB along the first direction D1.

For example, the third fan out lines FL3 may be connected to the first color data line RDL and then to the second color data line GDL. The third fan out lines FL3 may be connected to the third color data line BDL and then to the second color data line GDL. The third fan out lines FL3 may be connected to the second color data line GDL and then to the first color data line RDL or the third color data line BDL.

Figure 5:
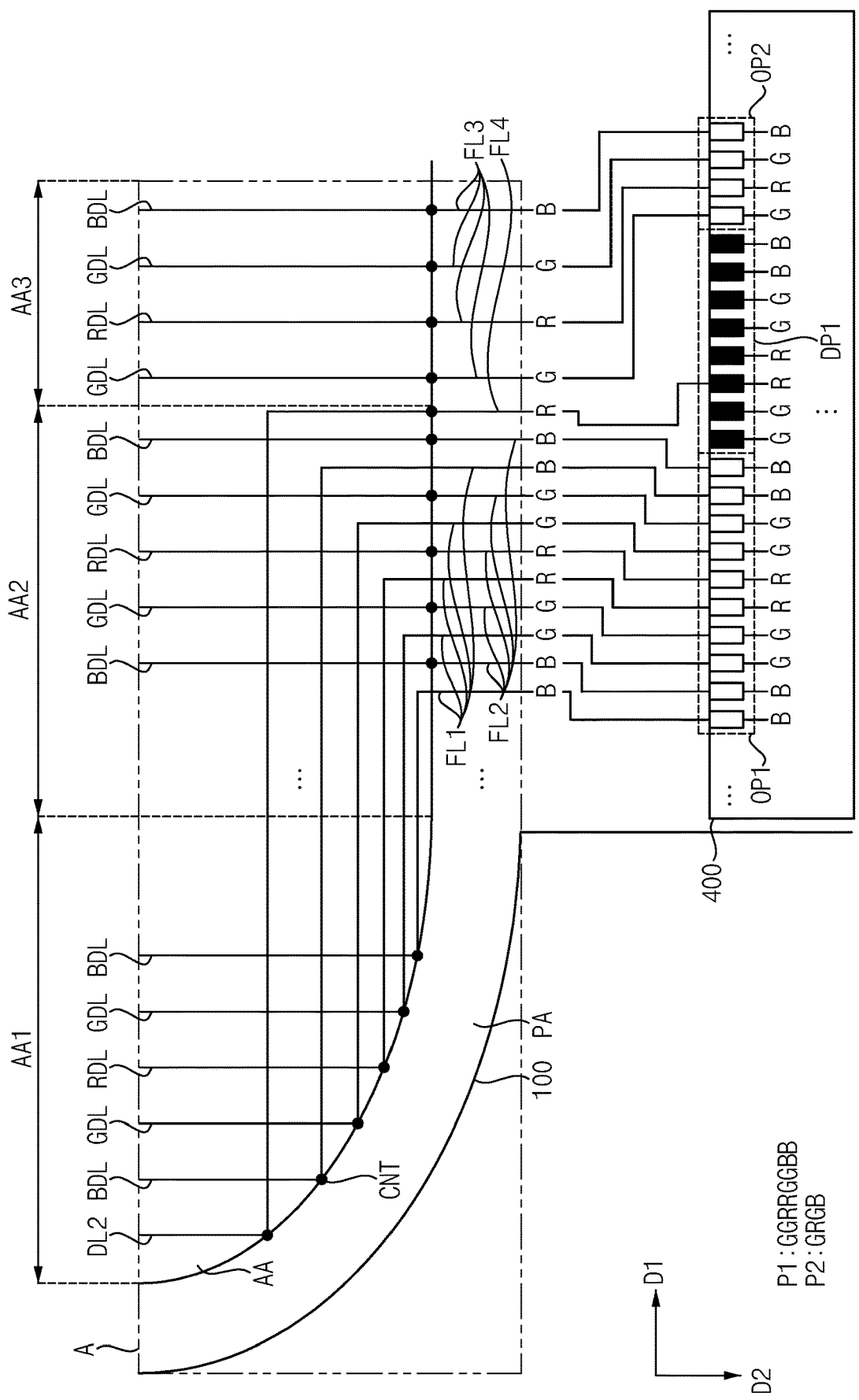
FIG. 5 is a diagram illustrating an example of an area A of FIG. 2 and a data driver of a display device according to embodiments of the present inventive concept.
Figure 6:
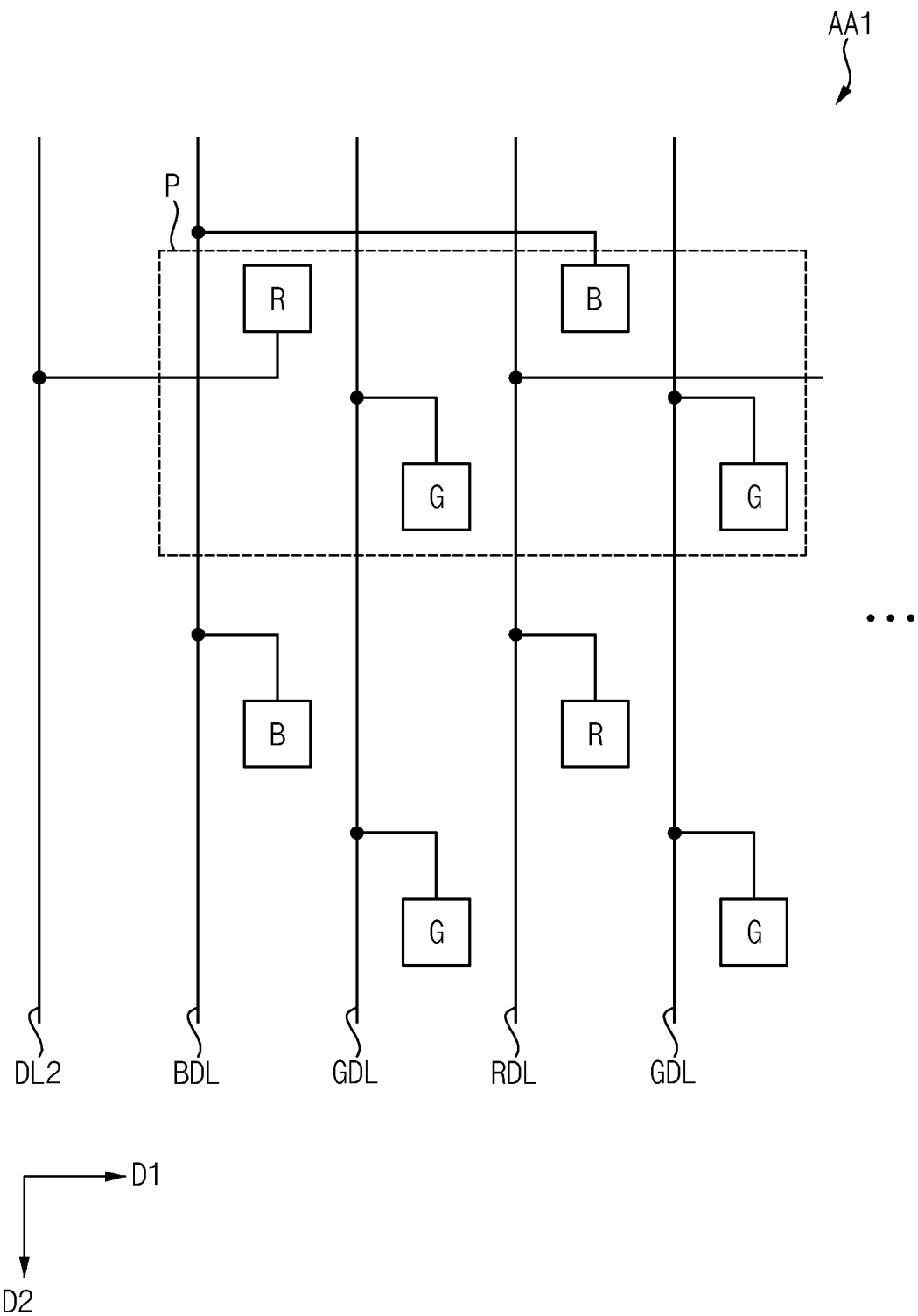
FIG. 6 is a diagram illustrating an example of sub-pixels disposed on a first display region adjacent to a second display region of the display device of FIG. 5 in a direction opposite to a first direction.

FIG. 5 is a diagram illustrating an example of the area A of FIG. 2 and the data driver 400 of a display device according to embodiments of the present inventive concept, and FIG. 6 is a diagram illustrating an example of the sub-pixels disposed on the first display region AA1 adjacent to the second display region AA2 of the display device of FIG. 5 in a direction opposite to the first direction D1.

The display device according to the present embodiment is substantially the same as the display device of FIG. 1 except for a second data line DL2, a fourth fan out line FL4, and a first dummy pads DP1. Thus, the same reference numerals are used to refer to the same or similar element, and any repetitive explanation will be omitted.

Referring to FIGS. 1, 2, 5, and 6, each of the first data lines RDL, GDL, and BDL may be connected to the sub-pixels in the direction opposite to the first direction D1. In this case, an additional data line (i.e., the second data line DL2) may be required.

For example, as shown in FIG. 6, each of the first data lines RDL, GDL, and BDL may be connected to the sub-pixels disposed in the first direction D1, and the first sub-pixels disposed in a first column may not be connected to the first data lines RDL, GDL, and BDL when the first data line RDL, GDL, and BDL disposed in left most column, for example, a first pixel column, is the third color data line BDL. Accordingly, the additional data line (i.e., the second data line DL2) connected to the first sub-pixel disposed in the left most column may be disposed in a left side of the first column. That is, the additional data line (i.e., the second data line DL2) may be disposed in the left side of the first column.

As such, the display panel 100 may further include the second data line DL2 disposed adjacent to the first data lines RDL, GDL, and BDL in the left side of the first column and connected to the first sub-pixels in the first column.

In this embodiment, it is exemplified that the first data line RDL, GDL, and BDL disposed in the left most side is the third color data line BDL, and the second data line DL2 is connected to the first sub-pixels, the present inventive concept is not limited thereto.

The fan out lines FL may further include the fourth fan out line FL4 connected to the second data line DL2. The fourth fan outline FL4 may be disposed between the second fan out line FL2 and the third fan outline FL3. The fourth fan out line FL4 may be a fan out line FL for outputting the data voltages to the second data line DL2.

For example, as shown in FIG. 5, the fourth fan out line FL4 may be connected to the second data line DL2 via the display region AA and the peripheral region PA. That is, the fourth fan outline FL4 may be disposed on the display region AA and the peripheral region PA.

The fourth fan out lines FL4 and the second data line DL2 may be disposed on different layers. The fourth fan out lines FL4 and the second data line DL2 may contact each other through the contact hole CNT.

The data driver 400 may further include the first dummy pads DP1. One of the first dummy pads DP1 determined according to the first arrangement P1 may output the data voltages to the fourth fan out line FL4.

For example, as shown in FIG. 5, the first dummy pads DP1 may be disposed between the first output pads OP1 and the second output pads OP2. As shown in FIG. 6, since the second data line DL2 is connected to the first sub-pixels disposed at the left most pixel column, the data driver 400 may output the data voltages for the first color R to the fourth fan out line FL4.

For example, the first arrangement P1 may be GGRRGGBB, and according to the first arrangement P1, the data voltages for the first color R may be input to third and fourth of the first dummy pads DP1. Therefore, one of the third or fourth of the first dummy pads DP1 may output the data voltages to the fourth fan out line FL4.

The number of the first dummy pads DP1 may be the number of colors constituting the first arrangement P1. Here, the number of colors does not mean the types of colors. For example, since the first arrangement P1 is GGRRGGBB, the number of colors constituting the first arrangement P1 is eight. Accordingly, the number of the first dummy pads DP1 may be eight.

Figure 7:
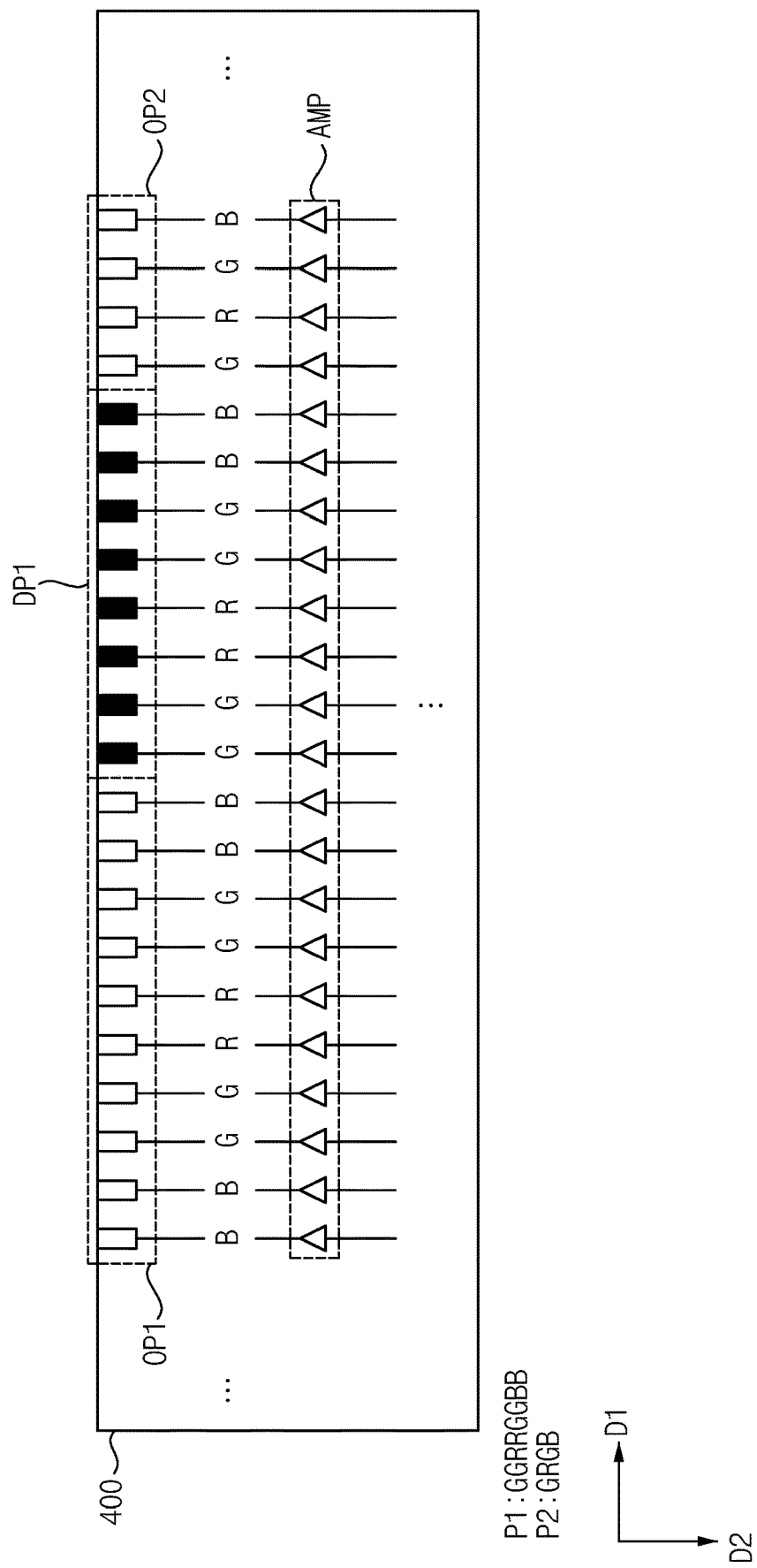
FIG. 7 is a diagram illustrating an example of output amplifiers of a data driver of the display device of FIG. 5.

FIG. 7 is a diagram illustrating an example of output amplifiers AMP of the data driver 400 of the display device of FIG. 5.

Referring to FIGS. 1 and 7, the data driver 400 may include the output amplifiers AMP connected to output pads including the first output pads OP1, the second output pads OP2, and the first dummy pads DP1, respectively. One output pad may be connected to one output amplifier AMP. The data driver 400 may output the data voltages through the output amplifier AMP.

Figure 8:
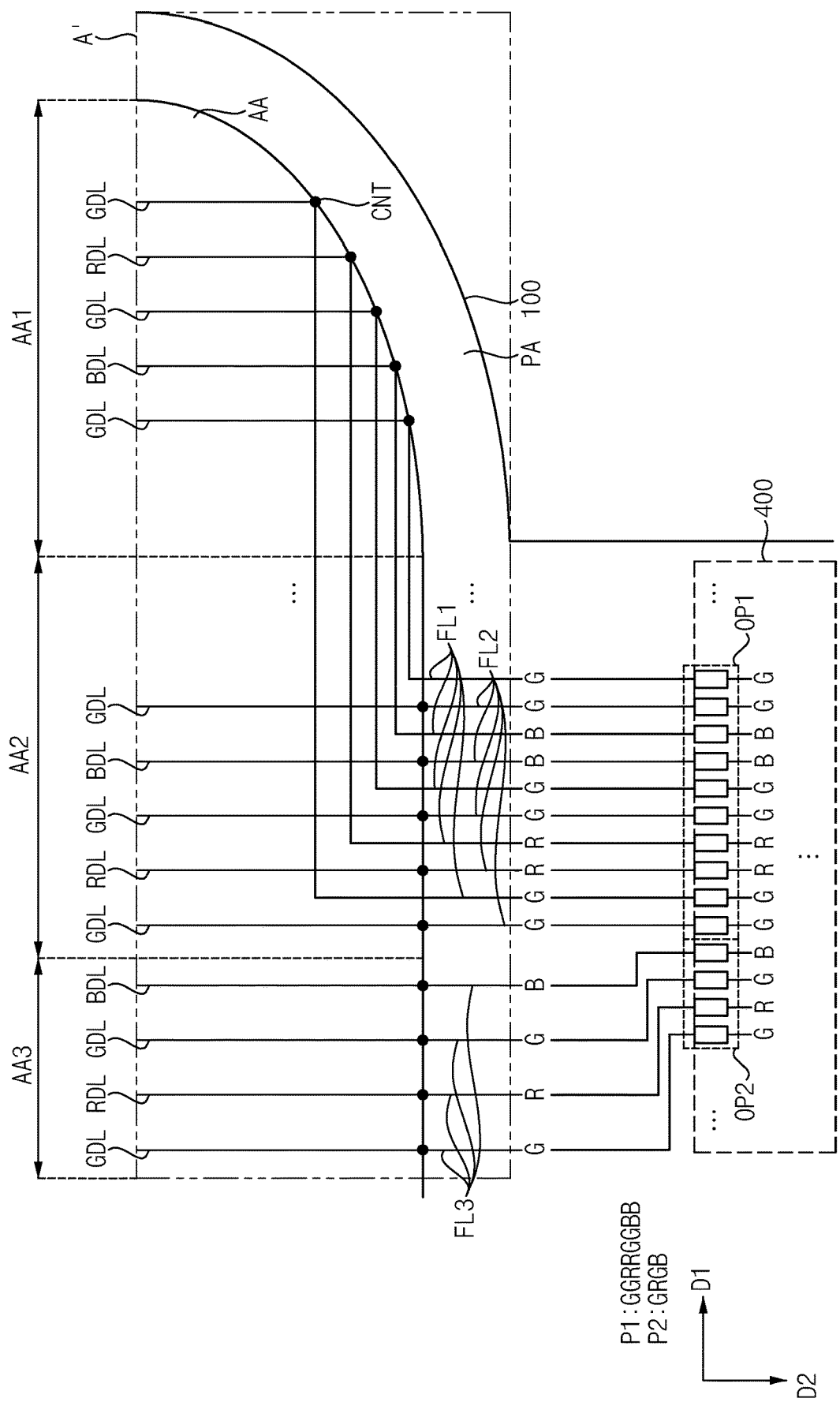
FIG. 8 is a diagram illustrating an example of an area A' of FIG. 2 and a data driver of the display device of FIG. 5.
Figure 9:
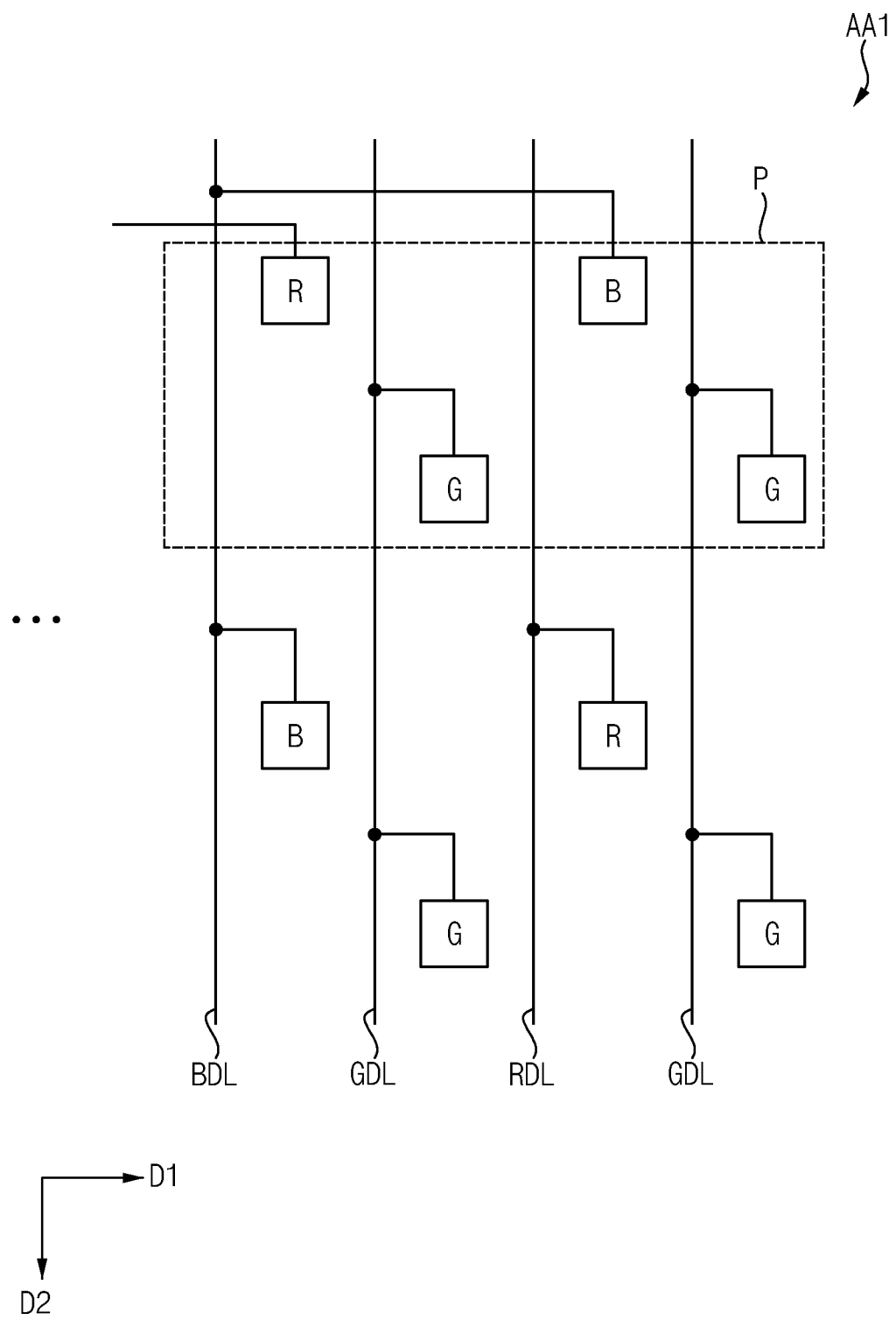
FIG. 9 is a diagram illustrating an example of sub-pixels disposed on a first display region adjacent to a second display region in a first direction of the display device of FIG. 5.

FIG. 8 is a diagram illustrating an example of an area A' of FIG. 2 and the data driver 400 of the display device of FIG. 5, and FIG. 9 is a diagram illustrating an example of the sub-pixels disposed on the first display region AA1 disposed adjacent to the second display region AA2 in the first direction D1 of the display device of FIG. 5.

Referring to FIGS. 1, 2, 8, and 9, each of the first data lines RDL, GDL, and BDL may be connected to the sub-pixels disposed in a right side of the first data lines RDL, GDL, and BDL. In this case, unlike FIG. 6, since the first data lines RDL, GDL, and BDL are disposed in a left side of the sub-pixels connected to the first data lines RDL, GDL, and BDL, an additional data line for the sub-pixels disposed in a right most column is not required.

Figure 10:
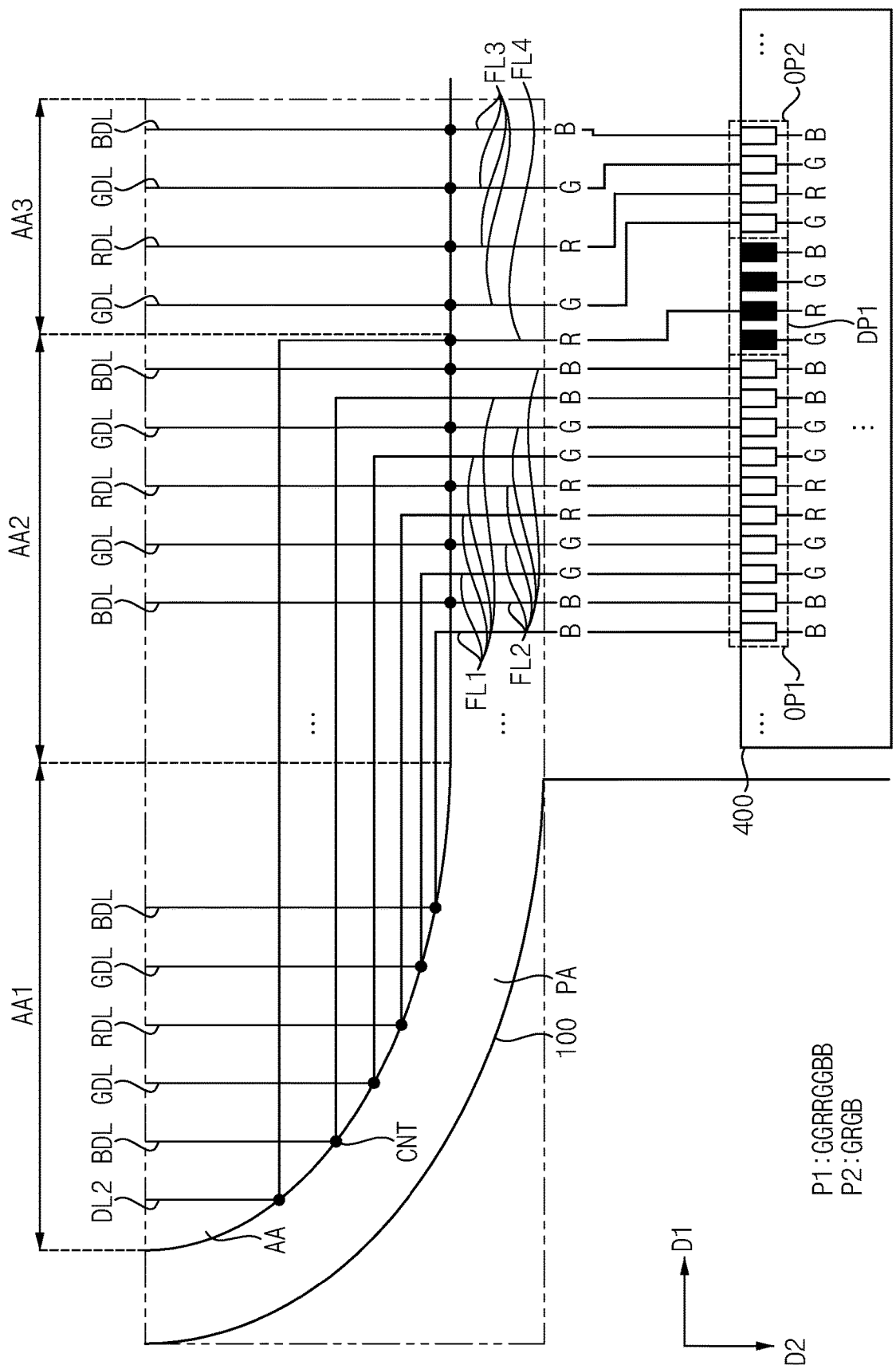
FIG. 10 is a diagram illustrating an example of an area A of FIG. 2 and a data driver of a display device according to embodiments of the present inventive concept.

FIG. 10 is a diagram illustrating an example of the area A of FIG. 2 and the data driver 400 of a display device according to embodiments of the present inventive concept.

The display device according to the present embodiment is substantially the same as the display device of FIG. 5 except for determining the first dummy pad DP1 connected to the fourth fan out line FL4 according to the second arrangement P2. Thus, the same reference numerals are used to refer to the same or similar element, and any repetitive explanation will be omitted.

Referring to FIGS. 1, 2, and 10, one of the first dummy pads DP1 determined according to the second arrangement P2 may output the data voltages to the fourth fan out line FL4.

For example, as shown in FIG. 10, the first dummy pads DP1 may be disposed between the first output pads OP1 and the second output pads OP2. As shown in FIG. 6, since the second data line DL2 is connected to the first sub-pixels in the first pixel column, the data driver 400 may output the data voltages for the first color R to the fourth fan out line FL4.

For example, the second arrangement P2 is GRGB, and according to the second arrangement P2, the data voltages for the first color R may be input to second of the first dummy pads DP1. Therefore, the second of the first dummy pads DP1 may output the data voltages to the fourth fan out line FL4.

The number of the first dummy pads DP1 may be the number of colors constituting the second arrangement P2. Here, the number of colors does not mean the types of colors. For example, since the second arrangement P2 is GRGB, the number of colors constituting the second arrangement P2 is four. Accordingly, the number of the first dummy pads DP1 may be four.

Figure 11:
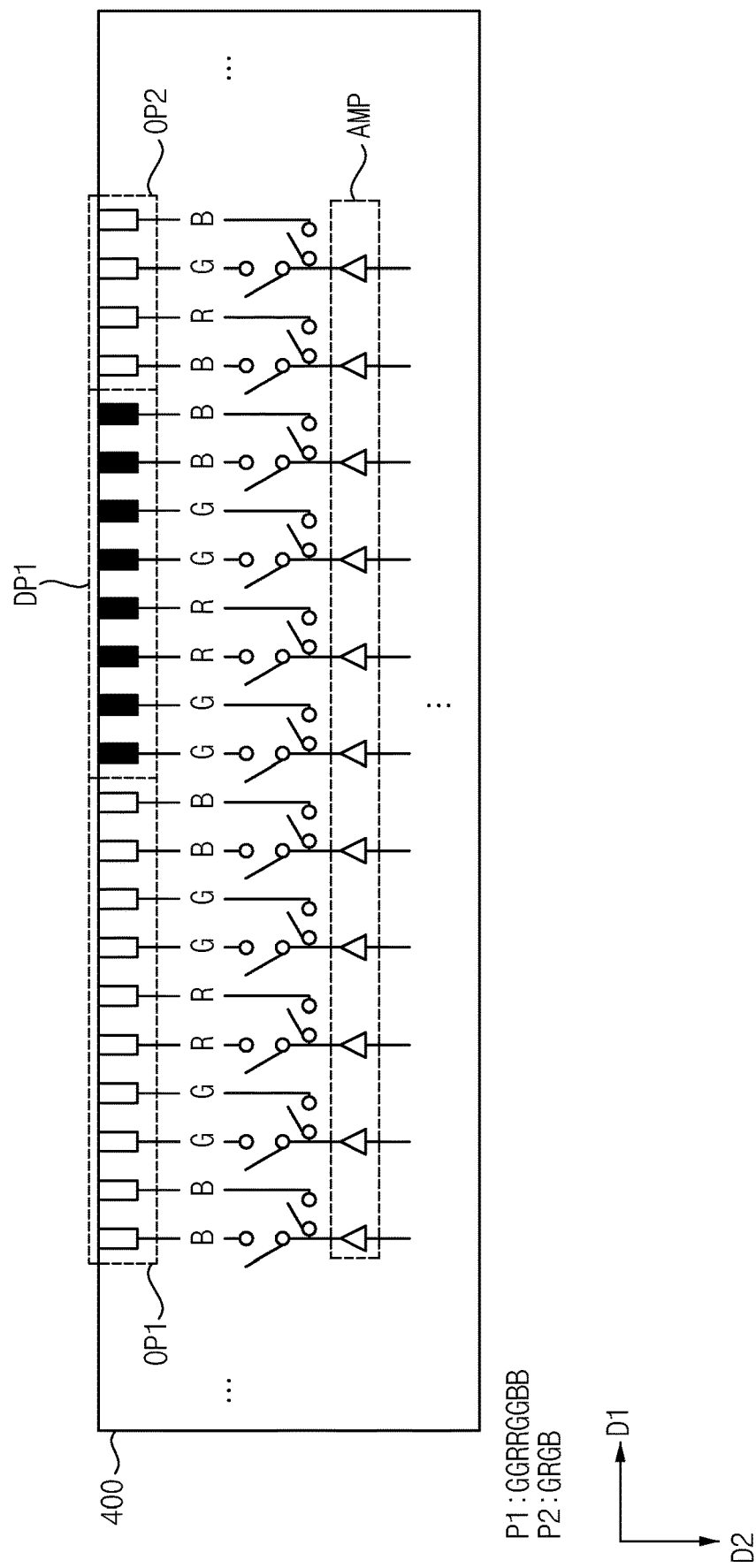
FIG. 11 is a diagram illustrating an example of output amplifiers of a data driver of a display device according to embodiments of the present inventive concept.

FIG. 11 is a diagram illustrating an example of the output amplifiers AMP of the data driver 400 of a display device according to embodiments of the present inventive concept.

The display device according to the present embodiment is substantially the same as the display device of FIG. 5 except for the output amplifiers AMP. Thus, the same reference numerals are used to refer to the same or similar element, and any repetitive explanation will be omitted.

Referring to FIGS. 1 and 11, the data driver 400 may include the output amplifiers AMP connected to at least two of the output pads including the first output pads OP1, the second output pads OP2, and the first dummy pads DP1. At least two of the output pads may be connected to one output amplifier AMP. The data driver 400 may output the data voltages through the output amplifier AMP.

For example, as shown in FIG. 11, one output amplifier AMP may be connected to two output pads through switches. Also, one output amplifier AMP may selectively output the data voltages to two output pads.

Figure 12:
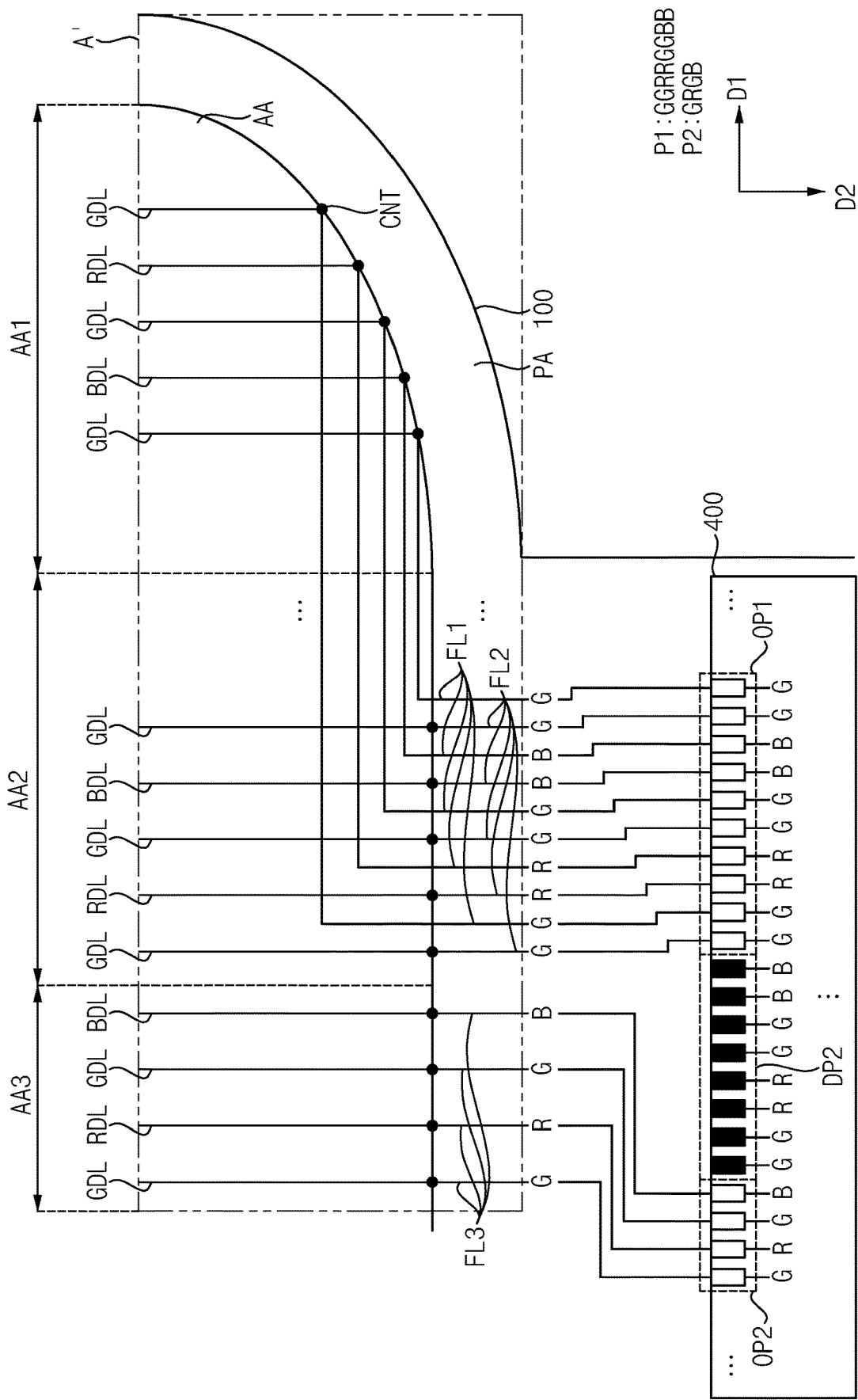
FIG. 12 is a diagram illustrating an example of an area A' of FIG. 2 and a data driver of a display device according to embodiments of the present inventive concept.

FIG. 12 is a diagram illustrating an example of an area A' of FIG. 2 and the data driver 400 of a display device according to embodiments of the present inventive concept.

The display device according to the present embodiment is substantially the same as the display device of FIG. 5 except for second dummy pads DP2. Thus, the same reference numerals are used to refer to the same or similar element, and any repetitive explanation will be omitted.

Referring to FIGS. 1, 2, and 12, the data driver 400 may further include the second dummy pads DP2 disposed between the second output pads OP2 and the first output pads OP1. Since the data driver 400 may include the first dummy pads DP1 and the second dummy pads DP2, the second data line DL2 may be disposed adjacent to a left most side of the first data lines RDL, GDL, and BDL, or the right most side of the first data lines RDL, GDL, and BDL.

Figure 13:
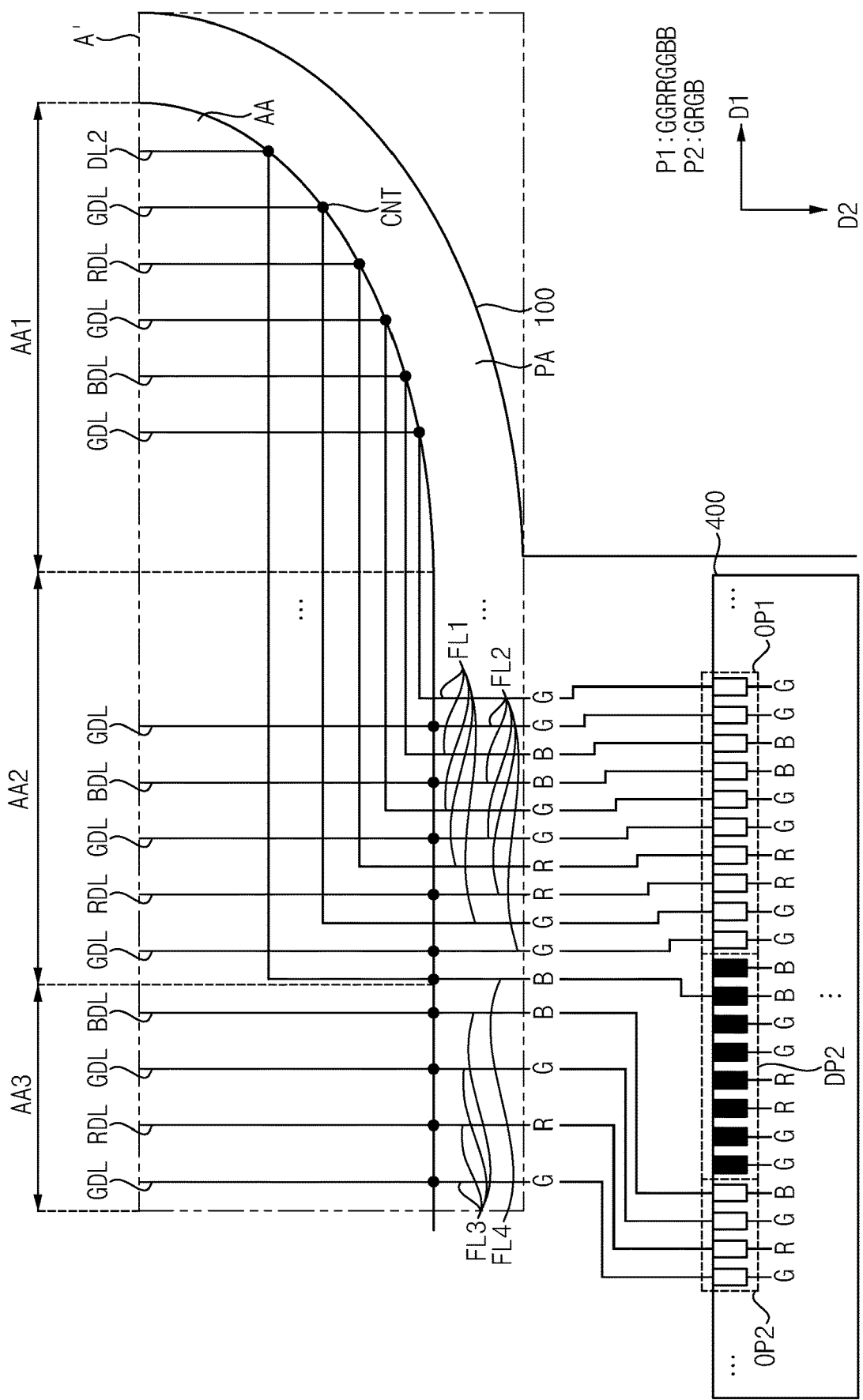
FIG. 13 is a diagram illustrating an example of an area A' of FIG. 2 and a data driver of a display device according to embodiments of the present inventive concept.
Figure 14:
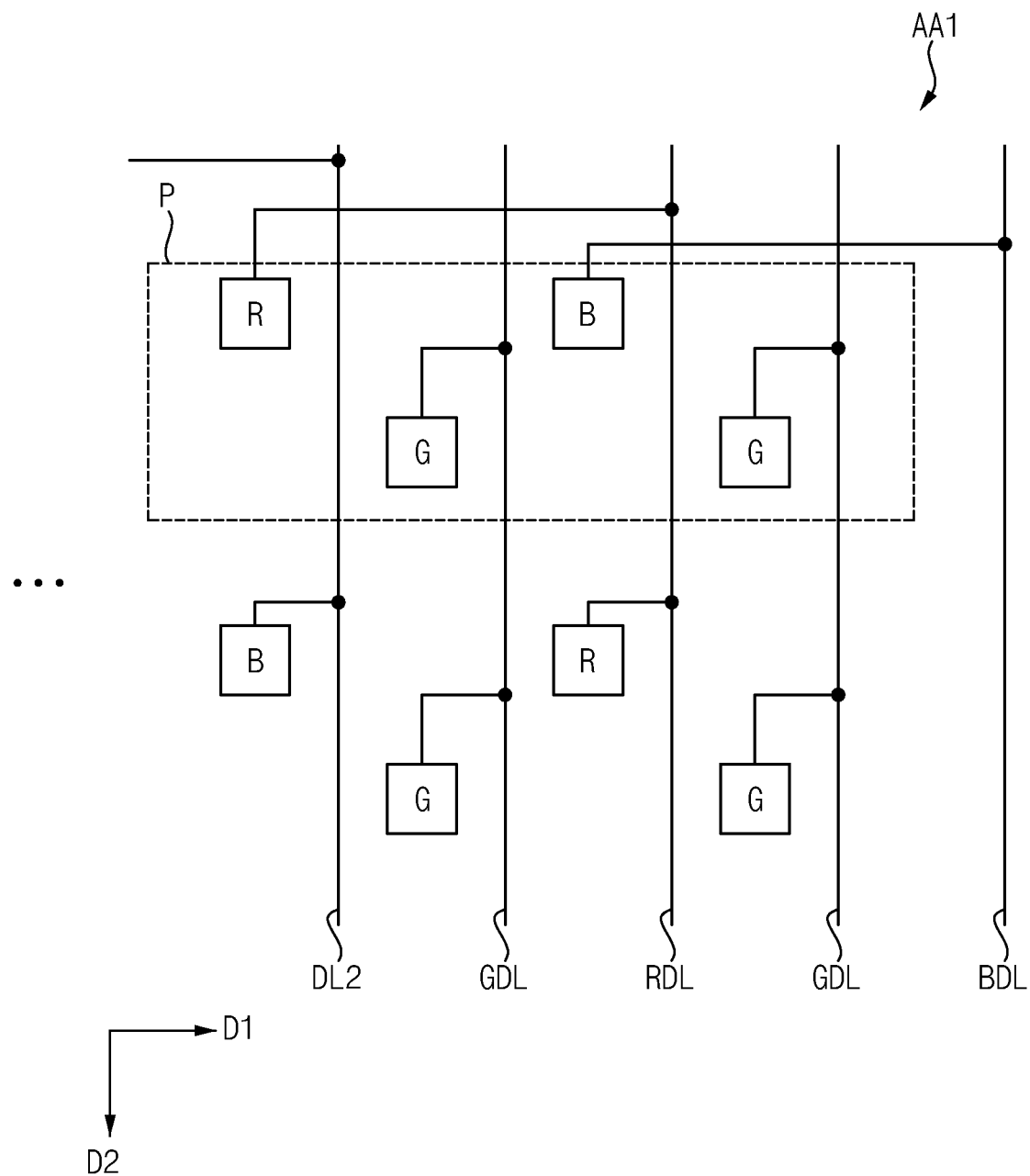
FIG. 14 is a diagram illustrating an example of sub-pixels disposed on a first display region adjacent to a second display region in a first direction of the display device of FIG. 13.

FIG. 13 is a diagram illustrating an example of the area A' of FIG. 2 and the data driver 400 of a display device according to embodiments of the present inventive concept, and FIG. 14 is a diagram illustrating an example of the sub-pixels disposed on the first display region AA1 adjacent to the second display region AA2 in the first direction D1 of the display device of FIG. 13.

The display device according to the present embodiment is substantially the same as the display device of FIG. 5 except for a position where the second data line DL2 is disposed and a structure according to the position. Thus, the same reference numerals are used to refer to the same or similar element, and any repetitive explanation will be omitted.

Referring to FIGS. 1, 2, 13, and 14, each of the first data lines RDL, GDL, and BDL may be connected to the sub-pixels disposed on a left side of the first data lines RDL, GDL, and BDL. In this case, an additional data line (i.e., the second data line DL2) may be required.

For example, as shown in FIG. 14, each of the first data lines RDL, GDL, and BDL may be connected to the sub-pixels disposed on the left side, and the third sub-pixels disposed in a second right most pixel column may be not connected to the first data lines RDL, GDL, and BDL because there is no first data line RDL, GDL, and BDL providing a data signal to the third sub-pixel disposed in the second right most pixel column. Accordingly, the additional data line (i.e., the second data line DL2) connected to the third sub-pixel disposed in the second right most pixel column may be disposed. That is, the additional data line (i.e., the second data line DL2) may be arranged in the right side of the first data lines RDL, GDL, and BDL which is a second color data line GDL.

As such, the display panel 100 may further include the second data line DL2 disposed adjacent to a right most second color data line GDL and connected to the first sub-pixels.

In this embodiment, it is exemplified that the first data line RDL, GDL, and BDL disposed in the right most side is the second color data line GDL, the first data line RDL, GDL, and BDL adjacent to the first data lines RDL, GDL, and BDL disposed in the right most side may be the first color data line RDL, and the second data line DL2 is connected to the third sub-pixels disposed on second right most pixel column, the present inventive concept is not limited thereto.

The fan out lines FL may further include the fourth fan out line FL4 connected to the second data line DL2. The fourth fan outline FL4 may be disposed between the second fan out line FL2 and the third fan outline FL3. The fourth fan out line FL4 may be a fan out line FL for outputting the data voltages to the second data line DL2.

For example, as shown in FIG. 13, the fourth fan out line FL4 may be connected to the second data line DL2 via the display region AA and the peripheral region PA. That is, the fourth fan outline FL4 may be disposed on the display region AA and the peripheral region PA.

The data driver 400 may further include the second dummy pads DP2. One of the second dummy pads DP2 determined according to the first arrangement P1 may output the data voltages to the fourth fan out line FL4.

For example, as shown in FIG. 13, the second dummy pads DP2 may be may be disposed between the first output pads OP1 and the second output pads OP2. As shown in FIG. 14, since the second data line DL2 is connected to the third sub-pixels disposed on the left side of the second data line DL2, the data driver 400 may output the data voltages for the third color B to the fourth fan out line FL4.

For example, the first arrangement P1 may be GGRRGGBB, and according to the second arrangement P2, the data voltages for the third color B may be input to seventh and eighth of the second dummy pads DP2. Therefore, one of the seventh or eighth of the second dummy pads DP2 may output the data voltages to the fourth fan out line FL4.

The number of the second dummy pads DP2 may be the number of colors constituting the first arrangement P1. Here, the number of colors does not mean the types of colors. For example, since the first arrangement P1 is GGRRGGBB, the number of colors constituting the first arrangement P1 is eight. Accordingly, the number of the second dummy pads DP2 may be eight.

Figure 15:
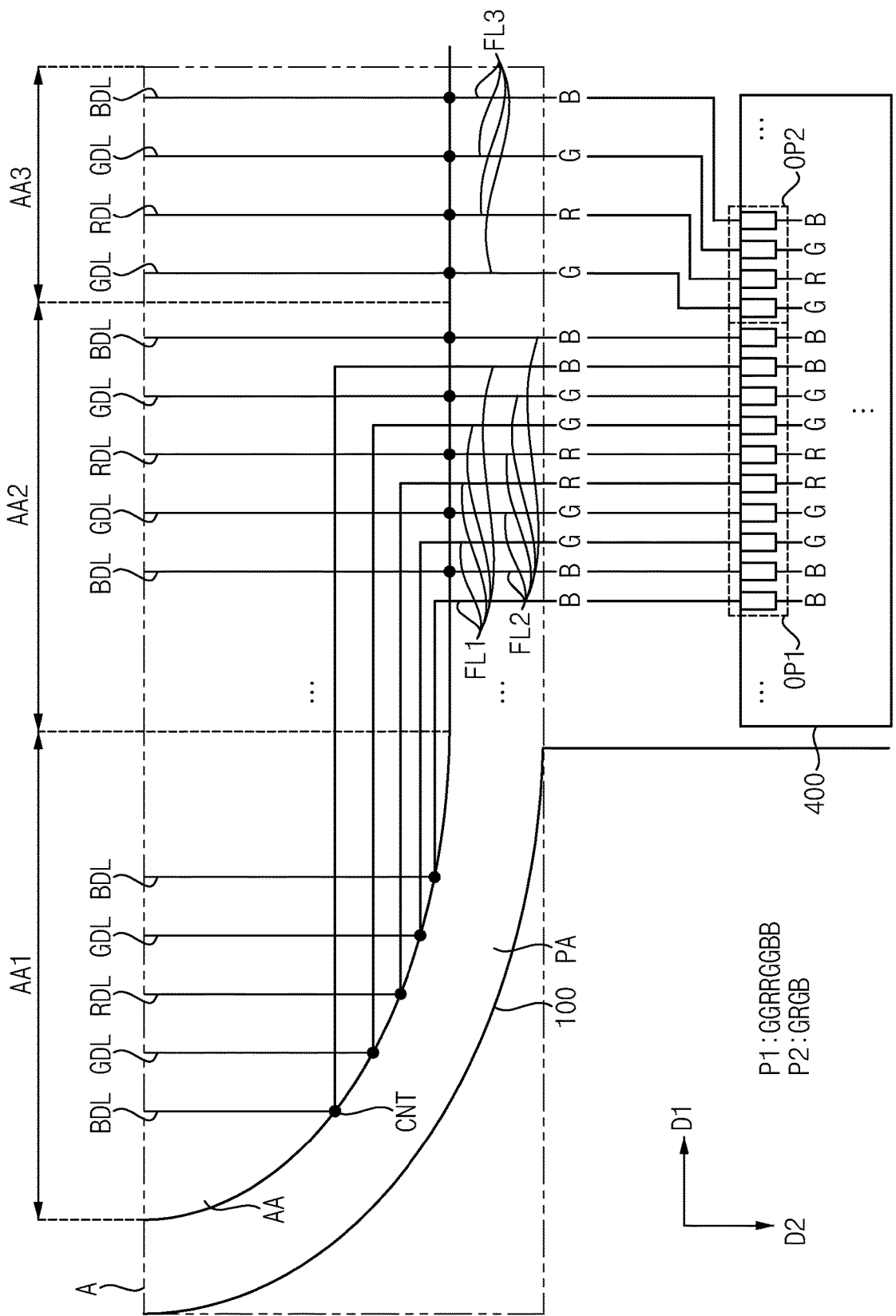
FIG. 15 is a diagram illustrating an example of an area A of FIG. 2 and a data driver of the display device of FIG. 13.
Figure 16:
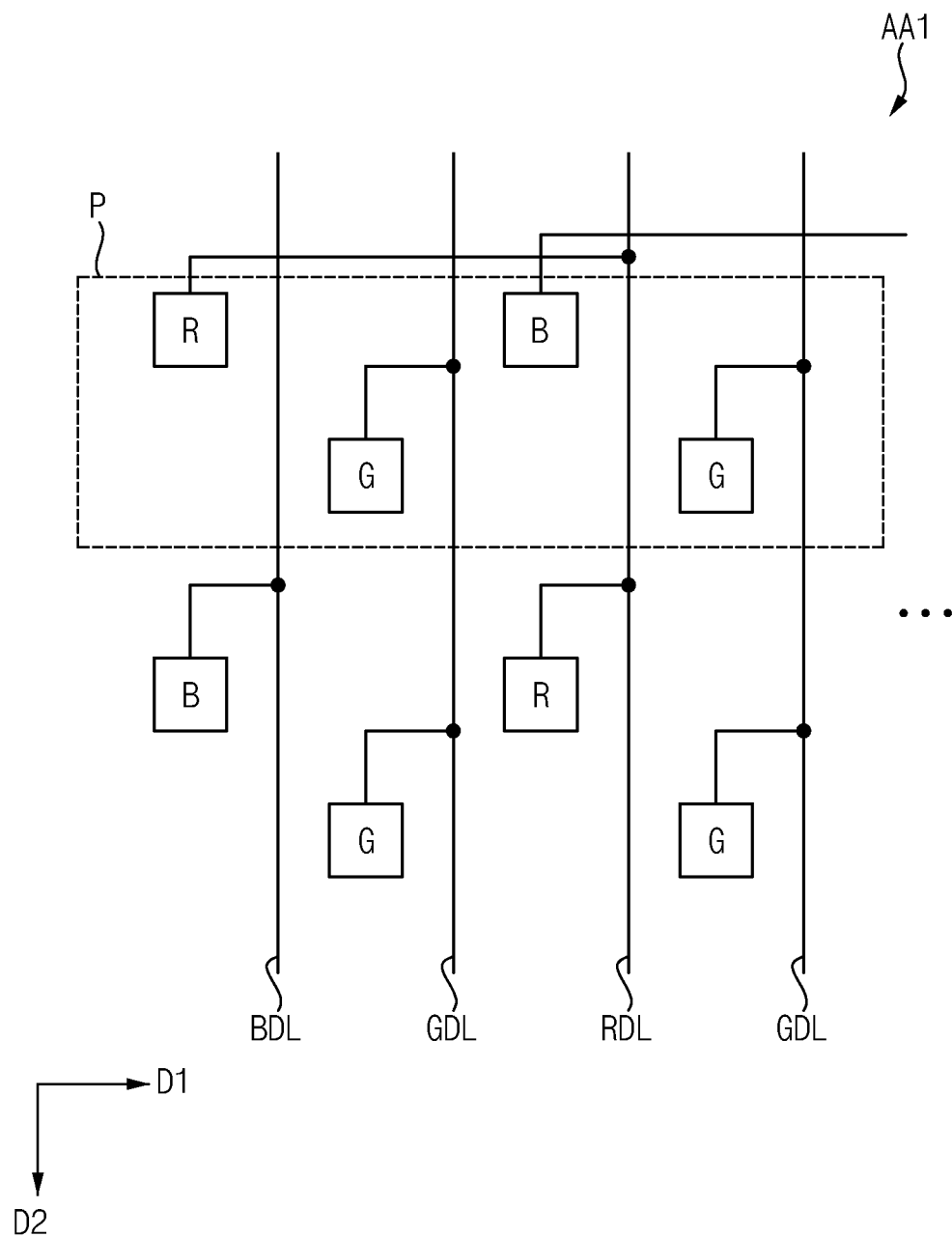
FIG. 16 is a diagram illustrating an example of sub-pixels disposed on a first display region adjacent to a second display region of the display device of FIG. 13 in a direction opposite to a first direction.

FIG. 15 is a diagram illustrating an example of the area A of FIG. 2 and the data driver 400 of the display device of FIG. 13, and FIG. 16 is a diagram illustrating an example of the sub-pixels disposed on the first display region AA1 adjacent to the second display region AA2 of the display device of FIG. 13 in the direction opposite to the first direction D1.

Referring to FIGS. 1, 2, 15, and 16, each of the first data lines RDL, GDL, and BDL may be connected to the sub-pixels disposed on the left side of the each of the first data lines RDL, GDL, and BDL. In this case, unlike FIG. 14, since the first data lines RDL, GDL, and BDL are disposed on the right side of the each of the sub-pixels connected to the each of the first data lines RDL, GDL, and BDL, respectively, an additional data line for the first sub-pixel or the third sub-pixel disposed in the left most column, for example, the first column, may not be required.

Figure 17:
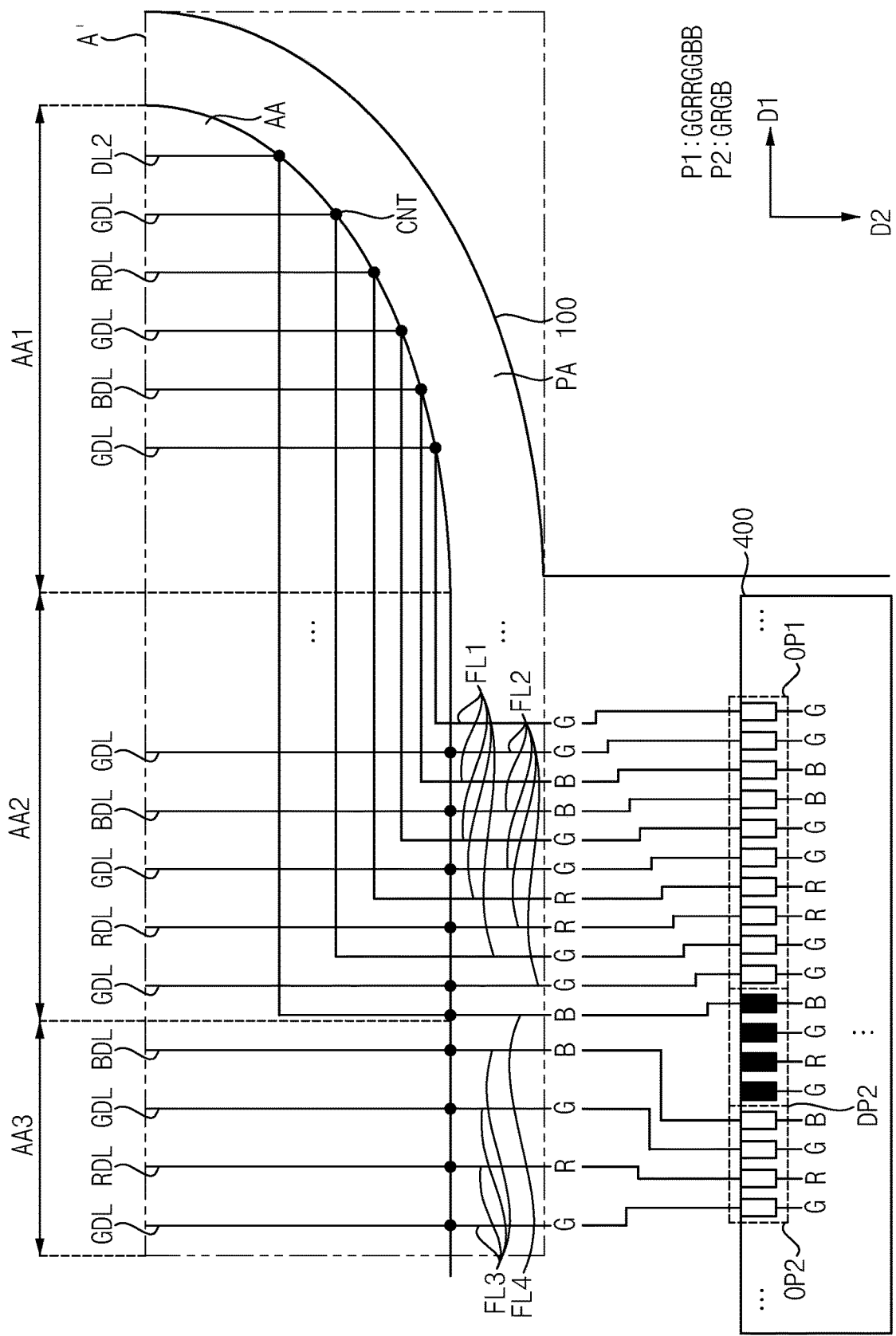
FIG. 17 is a diagram illustrating an example of an area A' of FIG. 2 and a data driver of a display device according to embodiments of the present inventive concept.

FIG. 17 is a diagram illustrating an example of the area A' of FIG. 2 and the data driver 400 of a display device according to embodiments of the present inventive concept.

The display device according to the present embodiment is substantially the same as the display device of FIG. 13 except for determining the second dummy pad DP2 connected to the fourth fan out line FL4 according to the second arrangement P2. Thus, the same reference numerals are used to refer to the same or similar element, and any repetitive explanation will be omitted.

Referring to FIGS. 1, 2, and 17, one of the second dummy pads DP2 determined according to the second arrangement P2 may output the data voltages to the fourth fan out line FL4.

For example, as shown in FIG. 17, the second dummy pads DP2 may be disposed between the first output pads OP1 and the second output pads OP2. Since the second data line DL2 is connected to the third sub-pixels, the data driver 400 may output the data voltages for the third color B to the fourth fan out line FL4.

For example, the second arrangement P2 is GRGB, and according to the second arrangement P2, the data voltages for the third color B may be input to fourth of the second dummy pads DP2. Therefore, the fourth of the second dummy pads DP2 may output the data voltages to the fourth fan out line FL4.

The number of the second dummy pads DP2 may be the number of colors constituting the second arrangement P2. Here, the number of colors does not mean the types of colors. For example, since the second arrangement P2 is GRGB, the number of colors constituting the second arrangement P2 is four. Accordingly, the number of the first dummy pads DP1 may be four.

Figure 18:
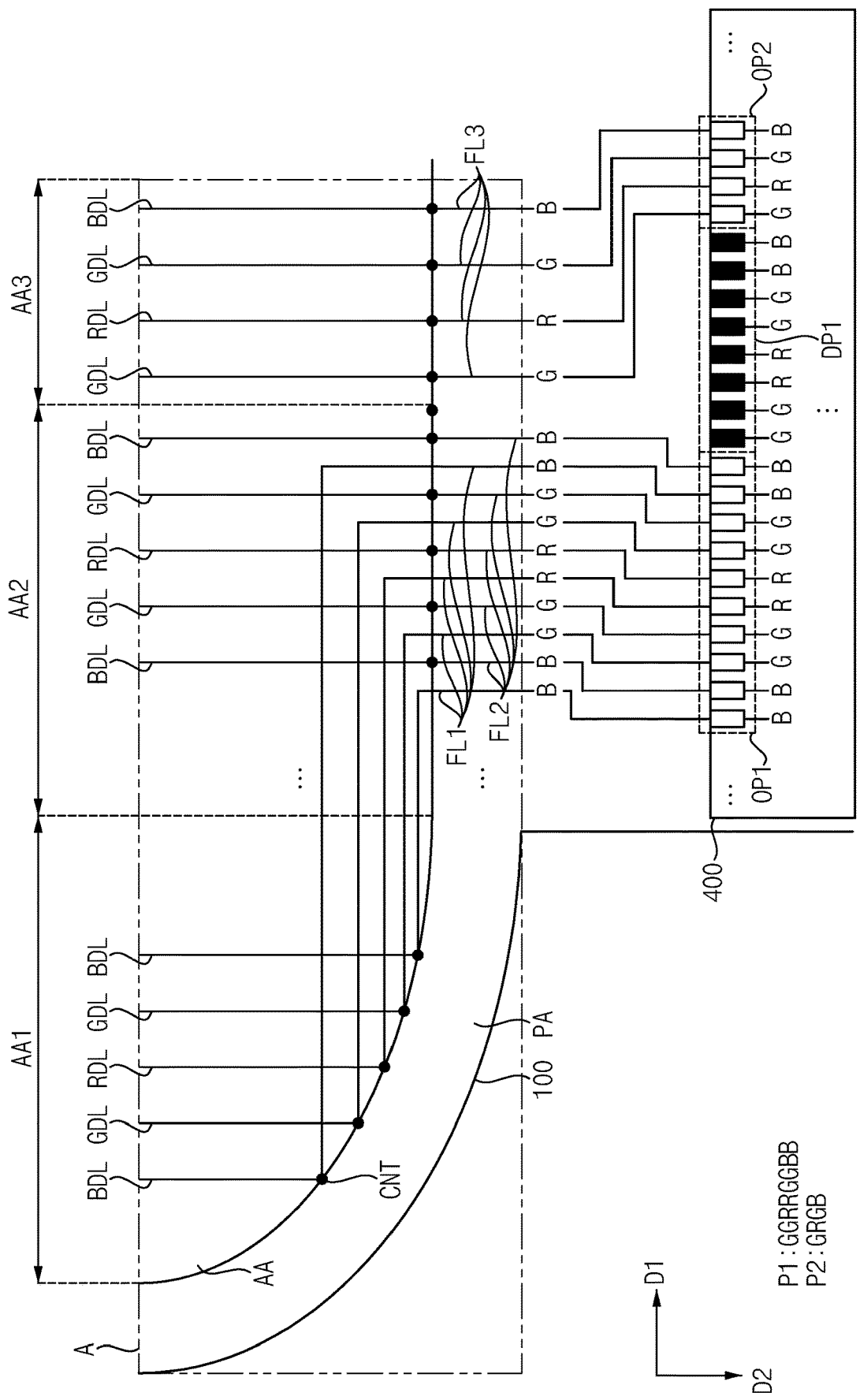
FIG. 18 is a diagram illustrating an example of an area A of FIG. 2 and a data driver of a display device according to embodiments of the present inventive concept.

FIG. 18 is a diagram illustrating an example of an area A of FIG. 2 and a data driver of a display device according to embodiments of the present inventive concept.

The display device according to the present embodiment is substantially the same as the display device of FIG. 13 except for the first dummy pads DP1. Thus, the same reference numerals are used to refer to the same or similar element, and any repetitive explanation will be omitted.

Referring to FIGS. 1, 2, and 18, the data driver 400 may further include the first dummy pads DP1 disposed between the first output pads OP1 and the second output pads OP2. Since the data driver 400 may include the first dummy pads DP1 and the second dummy pads DP2, the second data line DL2 may be disposed adjacent to a left most side of the first data lines RDL, GDL, and BDL, or the right most side of the first data lines RDL, GDL, and BDL.

Figure 19:
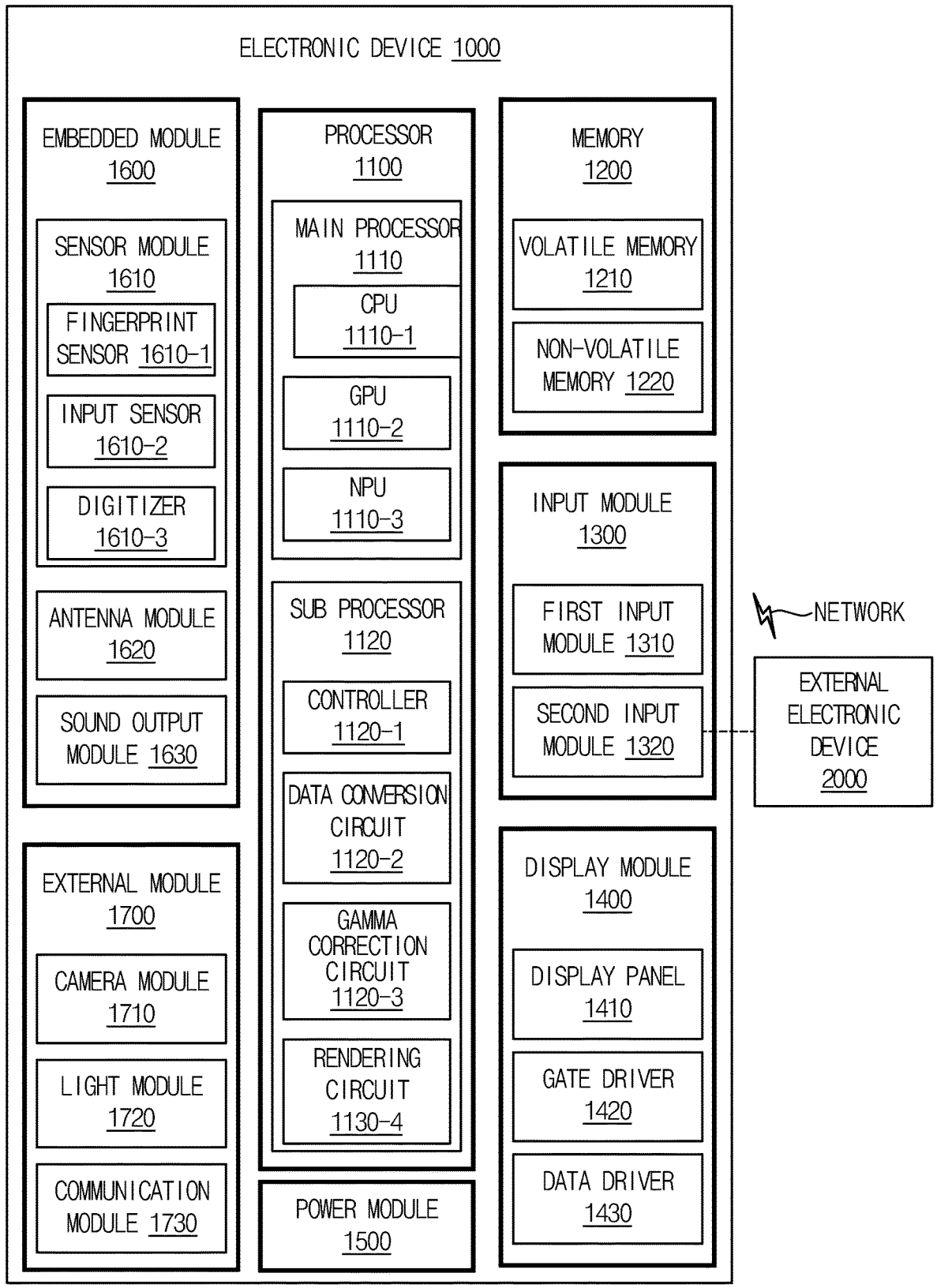
FIG. 19 is a block diagram showing an electronic device according to embodiments of the present inventive concept.
Figure 20:
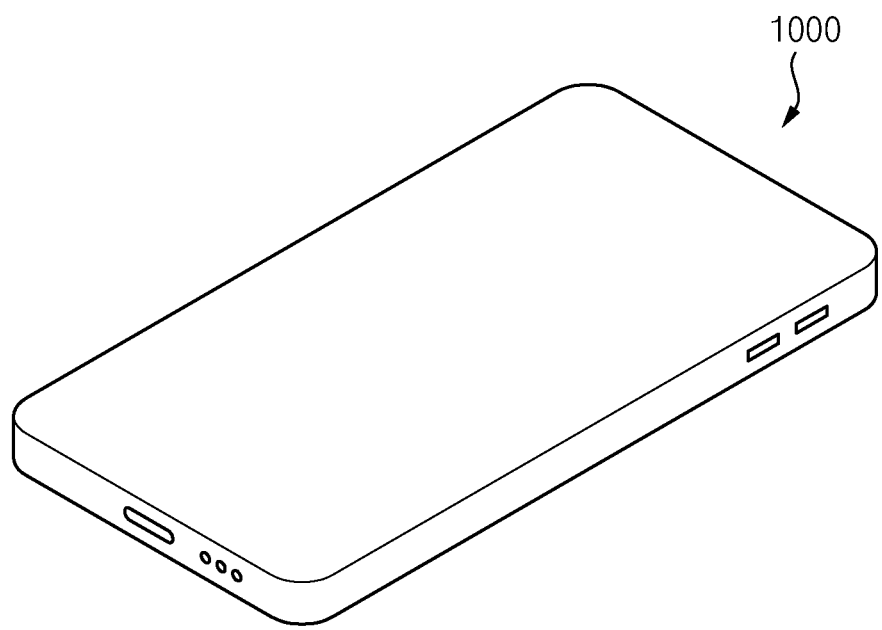
FIG. 20 is a diagram showing an example in which the electronic device of FIG. 11 is implemented as a smart phone.

FIG. 19 is a block diagram showing an electronic device according to embodiments of the present inventive concept, and FIG. 20 is a diagram showing an example in which the electronic device of FIG. 19 is implemented as a smart phone.

Referring to FIGS. 19 and 20, The electronic device 1000 may output various information through a display module 1400. When a processor 1100 executes an application stored in a memory 1200, the display module 1400 may provide information to a user through the display panel 1410. In this case, the display panel 1410 may be the display panel of FIG. 1.

In an embodiment, as shown in FIG. 20, the electronic device 1000 may be implemented as a smart phone. However, the electronic device 1000 is not limited thereto. For example, the electronic device 1000 may be implemented as a cellular phone, a video phone, a smart pad, a smart watch, a tablet PC, a car navigation system, a computer monitor, a laptop, a head mounted display (HMD) device, etc.

The processor 1100 may obtain an external input through an input module 1300 or a sensor module 1610 and execute an application corresponding to an external input. In an embodiment, when the user selects a camera icon displayed on the display panel 1410, the processor 1100 may obtain a user input through an input sensor 1610-2 and activate a camera module 1710. The processor 1100 may transmit a data signal corresponding to a photographed image acquired through the camera module 1710 to the display device 1400. The display device 1400 may display an image corresponding to the photographed image through the display panel 1410.

In another embodiment, when personal information authentication is executed in the display module 1400, a fingerprint sensor 1610-1 may obtain input fingerprint information as input data. The processor 1100 may compare the input data acquired through the fingerprint sensor 1610-1 with authentication data stored in the memory 1200, and execute the application according to a comparison result. The display module 1400 may display information executed according to application logic through the display panel 1410.

In another embodiment, when a music streaming icon displayed on the display module 1400 is selected, the processor 1100 may obtain the user input through the input sensor 1610-2 and activate a music streaming application stored in the memory 1200. When a music execution command is input in the music streaming application, the processor 1100 may activate a sound output module 1630 to provide sound information corresponding to the music execution command to the user.

In the above, operation of the electronic device 1000 has been briefly described. Hereinafter, components of the electronic device 1000 will be described in detail. Some of components of the electronic device 1000 described later may be integrated and provided as one component, or one component may be provided separately as two or more components.

The electronic device 1000 may communicate with an external electronic device 2000 through a network (e.g., a short-distance wireless communication network or a long-distance wireless communication network). According to an embodiment, the electronic device 1000 may include the processor 1100, the memory 1200, the input module 1300, the display module 1400, a power module 1500, an embedded module 1600, and an external module 1700. According to an embodiment, in the electronic device 1000, at least one of the above-described components may be omitted or one or more other components may be added. According to an embodiment, some of components (e.g., the sensor module 1610, an antenna module 1620, or the sound output module 1630) may be integrated into another component (e.g., the display module 1400).

The processor 1100 may execute software to control at least one other component (e.g., hardware or software component) of the electronic device 1000 connected to the processor 1100, and perform various data processing or calculations. According to an embodiment, as at least part of the data processing or calculation, the processor 1100 may store commands or data received from other components (e.g., the input module 1300, the sensor module 1610, or the communication module 1730) in a volatile memory 1210, and process the commands or data stored in the volatile memory 1210, and resulting data may be stored in a non-volatile memory 1220.

The processor 1100 may include a main processor 1110 and an sub processor 1120. The main processor 1110 may include one or more of a central processing unit (CPU) 1110-1 or an application processor (AP). The main processor 1110 may further include any one or more of the graphic processing unit (GPU) 1110-2, a communication processor (CP), and an image signal processor (ISP). The main processor 1110 may further include a neural processing unit (NPU) 1110-3. The neural network processing unit may be a processor specialized in processing an artificial intelligence model, and the artificial intelligence model may be generated through machine learning. The artificial intelligence model may include a plurality of artificial neural network layers. Artificial neural networks may include deep neural networks (DNNs), convolutional neural networks (CNNs), recurrent neural networks (RNNs), restricted boltzmann machines (RBMs), deep belief networks (DBNs), bidirectional recurrent deep neural networks (BRDNNs), deep Q-networks or a combination of two or more of the foregoing, but is not limited to the above examples. The artificial intelligence model may include, in addition or alternatively, a software structure in addition to a hardware structure. At least two of the above-described processing unit and processor may be implemented as an integrated component (e.g., a single chip) or each may be implemented as an independent component (e.g., a plurality of chips).

The sub processor 1120 may include a controller 1120-1. The controller 1120-1 may include an interface conversion circuit and a timing control circuit. The controller 1120-1 may receive the input image data from the main processor 1110, convert a data format of the input image data to meet interface specifications with the display module 1400, and output the data signal. The controller 1120-1 may output various control signals necessary for driving the display module 1400.

The sub processor 1120 may further include a data conversion circuit 1120-2, a gamma correction circuit 1120-3, a rendering circuit 1120-4, and the like. The data conversion circuit 1120-2 may receive the data signal from the controller 1120-1 and compensate for the data signal so that an image is displayed with a desired luminance according to characteristics of the electronic device 1000 or a user's setting, or convert the data signal to reduce power consumption or compensate for afterimages. The gamma correction circuit 1120-3 may convert the data signal or the gamma reference voltage so that an image displayed on the electronic device 1000 has desired gamma characteristics. The rendering circuit 1120-4 may receive the data signal from the controller 1120-1 and render the data signal in consideration of a pixel arrangement of the display panel 1410 applied to the electronic device 1000. At least one of the data conversion circuit 1120-2, the gamma correction circuit 1120-3, and the rendering circuit 1120-4 may be integrated into other components (e.g., the main processor 1110 or the controller 1120-1).

At least one of the controller 1120-1, the data conversion circuit 1120-2, the gamma correction circuit 1120-3, and the rendering circuit 1120-4 may be integrated into a data driver 1430 described later.

In this case, the sub processor 1120 may be the timing controller of FIG. 1.

The memory 1200 may store various data used by at least one component (e.g., the processor 1100 or the sensor module 1610) of the electronic device 1000 and input data or output data for commands related the various data. The memory 1200 may include at least one of the volatile memory 1210 and the non-volatile memory 1220.

The input module 1300 may receive commands or data to be used for components (e.g., the processor 1100, the sensor module 1610 or the sound output module 1630) of the electronic device 1000 from outside the electronic device 1000 (e.g., the user or the external electronic device 2000).

The input module 1300 may include a first input module 1310 into which the command or data is input from the user and a second input module 1320 into which the command or data is input from the external electronic device 2000. The first input module 1310 may include a microphone, a mouse, a keyboard, a key (e.g., a button), or a pen (e.g., a passive pen or an active pen). The second input module 1320 may support a designated protocol capable of connecting to the external electronic device 2000 by wire or wirelessly. According to an embodiment, the second input module 1320 may include a high definition multimedia interface (HDMI), a universal serial bus (USB) interface, an SD card interface, or an audio interface. The second input module 1320 may include a connector that can be physically connected to the external electronic device 2000, for example, an HDMI connector, a USB connector, an SD card connector, or an audio connector (e.g., a headphone connector).

The display module 1400 may visually provide information to the user. The display module 1400 may include the display panel 1410, the gate driver 1420, and the data driver 1430. The display module 1400 may further include a window, a chassis, and a bracket to protect the display panel 1410. In this case, the gate driver 1420 and the data driver 1430 may be the gate driver and data driver of FIG. 1.

The display panel 1410 may include a liquid crystal display panel, an organic light emitting display panel, or an inorganic light emitting display panel, and the type of display panel 1410 is not particularly limited. The display panel 1410 may be a rigid type or a flexible type capable of being rolled or folded. The display module 1400 may further include a supporter, a bracket, or a heat dissipation member that supports the display panel 1410.

The gate driver 1420 may be mounted on the display panel 1410 as a driving chip. Also, the gate driver 1420 may be integrated into the display panel 1410. For example, the gate driver 1420 may include an amorphous silicon TFT gate driver circuit (ASG), a low temperature polycrystalline silicon (LTPS) TFT gate driver circuit, or an oxide semiconductor TFT gate driver circuit (OS G) formed at the same time with the display panel forming elements (e.g., light emitting elements, transistors, etc.) disposed in the display panel 1410. The gate driver 1420 may receive a control signal from the controller 1120-1 and output the gate signals to the display panel 1410 in response to the control signal.

The display panel 1410 may further include an emission driver. The emission driver may output an emission signal to the display panel 1410 in response to the control signal received from the controller 1120-1. The emission driver may be formed separately from the gate driver 1420 or integrated into the gate driver 1420.

The data driver 1430 may receive a control signal from the controller 1120-1, convert the data signal into an analog voltage (e.g., the data voltage) in response to the control signal, and then output the data voltages to the display panel 1410.

The data driver 1430 may be integrated into other components (e.g., the controller 1120-1). The functions of the interface conversion circuit and the timing control circuit of the controller 1120-1 described above may be integrated into the data driver 1430.

The display module 1400 may further include a light driver and a voltage generating circuit. The voltage generating circuit may output various voltages necessary for driving the display panel 1410.

The power module 1500 may supply power to components of the electronic device 1000. The power module 1500 may include a battery that charges a power voltage. A battery may include a non-rechargeable primary cell, a rechargeable secondary cell or a fuel cell. The power module 1500 may include a power management integrated circuit (PMIC). The PMIC may supply optimized power to each of the above-described modules and modules described later. The power module 1500 may include a wireless power transmission/reception member electrically connected to the battery. The wireless power transmission/reception member may include a plurality of antenna radiators in the form of coils.

The electronic device 1000 may further include the embedded module 1600 and the external module 1700. The embedded module 1600 may include the sensor module 1610, the antenna module 1620, and the sound output module 1630. The external module 1700 may include the camera module 1710, a light module 1720, and the communication module 1730.

The sensor module 1610 may detect an input by a user's body or an input by a pen among the first input module 1310, and generate an electrical signal or data value corresponding to the input. The sensor module 1610 may include at least one of the fingerprint sensor 1610-1, the input sensor 1610-2, and a digitizer 1610-3.

The fingerprint sensor 1610-1 may generate a data value corresponding to the user's fingerprint. The fingerprint sensor 1610-1 may include either an optical or capacitive fingerprint sensor.

The input sensor 1610-2 may generate data values corresponding to coordinate information of an input by a user's body or a pen. The input sensor 1610-2 may generate a capacitance change due to the input as the data value. The input sensor 1610-2 may detect the input by the passive pen or transmit/receive data to/from the active pen.

The input sensor 1610-2 may measure a biosignal such as blood pressure, moisture, or body fat. For example, when the user touches a part of his body to a sensor layer or sensing panel and does not move for a certain period of time, the input sensor 1610-2 may detect the biosignal based on a change in electric field caused by the part of the user's body. Information desired by the user may be output to the display module 1400.

The digitizer 1610-3 may generate data values corresponding to coordinate information input by the pen. The digitizer 1610-3 may generate the amount of electromagnetic change by the input as the data value. The digitizer 1610-3 may detect the input by the passive pen or transmit/receive data to/from the active pen.

At least one of the fingerprint sensor 1610-1, the input sensor 1610-2, and the digitizer 1610-3 may be implemented as the sensor layer formed on the display panel 1410 through a continuous process. The fingerprint sensor 1610-1, the input sensor 1610-2, and the digitizer 1610-3 may be disposed above the display panel 1410, and any one of the fingerprint sensor 1610-1, the input sensor 1610-2, and the digitizer 1610-3, for example, the digitizer 1610-3 may be disposed below the display panel 1410.

At least two or more of the fingerprint sensor 1610-1, the input sensor 1610-2, and the digitizer 1610-3 may be integrated into one sensing panel through the same process. When integrated into one sensing panel, the sensing panel may be disposed between the display panel 1410 and the window disposed above the display panel 1410. According to an embodiment, the sensing panel may be disposed on the window, and the location of the sensing panel is not particularly limited.

At least one of the fingerprint sensor 1610-1, the input sensor 1610-2, and the digitizer 1610-3 may be embedded in the display panel 1410. That is, at least one of the fingerprint sensor 1610-1, the input sensor 1610-2, and the digitizer 1610-3 may be simultaneously formed through a process of forming elements (e.g., light emitting elements, transistors, etc.) included in the display panel 1410.

In addition, the sensor module 1610 may generate an electrical signal or data value corresponding to an internal state or an external state of the electronic device 1000. The sensor module 1610 may be further included, for example, a gesture sensor, a gyro sensor, a barometric pressure sensor, a magnetic sensor, an acceleration sensor, a grip sensor, a proximity sensor, a color sensor, an infrared (IR) sensor, a biosensor, a temperature sensor, a humidity sensor, or an illuminance sensor.

The antenna module 1620 may include one or more antennas for transmitting or receiving signals or power to the outside. According to an embodiment, the communication module 1730 may transmit a signal to an external electronic device or receive a signal from an external electronic device through an antenna suitable for a communication method. The antenna pattern of the antenna module 1620 may be integrated into one component of the display module 1400 (e.g., the display panel 1410) or the input sensor 1610-2.

The sound output module 1630 may be a device for outputting a sound signal to the outside of the electronic device 1000, and include, for example, a speaker used for general purposes such as multimedia playback or recording playback and a receiver used exclusively for receiving calls. According to an embodiment, the receiver may be formed integrally with or separately from the speaker. A sound output pattern of the sound output module 1630 may be integrated with the display module 1400.

The camera module 1710 may capture still images and moving images. According to an embodiment, the camera module 1710 may include one or more lenses, image sensors, or image signal processors. The camera module 1710 may further include an infrared camera capable of measuring the presence or absence of the user, the user's location, and the user's line of sight.

The light module 1720 may provide light. The light module 1720 may include a light emitting diode or a xenon lamp. The light module 1720 may operate in conjunction with the camera module 1710 or operate independently.

The communication module 1730 may support establishing a wired or wireless communication channel between the electronic device 1000 and the external electronic device 2000 and performing communication through the established communication channel. The communication module 1730 may include one or all of be a wireless communication module such as a cellular communication module, a short-range wireless communication module, or a global navigation satellite system (GNSS) communication module, and a wired communication module such as a local area network (LAN) communication module or a power line communication module. The communication module 1730 may communicate with the external electronic device 2000 through a short-range communication network such as Bluetooth, WiFi direct, or infrared data association (IrDA) or a long-distance communication network such as a cellular network, the Internet, or a computer network (e.g., LAN or WAN). The various types of communication modules 1730 described above may be implemented as a single chip or may be implemented as separate chips.

The input module 1300, the sensor module 1610, the camera module 1710, and the like may be used to control the operation of the display module 1400 in conjunction with the processor 1100.

The processor 1100 may output commands or data to the display module 1400, the sound output module 1630, the camera module 1710, or the light module 1720 based on input data received from the input module 1300. For example, the processor 1100 may generate a data signal corresponding to input data applied through the mouse or the active pen and output the data signal to the display module 1400 or generate command data corresponding to input data and output the command data to the camera module 1710 or the light module 1720. When the input data is not received from the input module 1300 for a certain period of time, the processor 1100 may convert an operation mode of the electronic device 1000 into a low power mode or a sleep mode to reduce power consumption.

The processor 1100 may output commands or data to the display module 1400, the sound output module 1630, the camera module 1710, or the light module 1720 based on sensing data received from the sensor module 1610. For example, the processor 1100 may compare authentication data applied by the fingerprint sensor 1610-1 with authentication data stored in the memory 1200, and then execute an application according to the comparison result. The processor 1100 may execute a command or output a corresponding data signal to the display module 1400 based on the sensing data sensed by the input sensor 1610-2 or the digitizer 1610-3. When the sensor module 1610 includes a temperature sensor, the processor 1100 may receive temperature data about the temperature measured from the sensor module 1610 and further perform luminance correction on the data signal based on the temperature data.

The processor 1100 may receive measurement data about the presence or absence of the user, the user's location, and the user's gaze from the camera module 1710. The processor 1100 may further perform luminance correction on the data signal based on the measurement data. For example, the processor 1100 that determines whether or not there is the user through an input from the camera module 1710 may output a data signal whose luminance is corrected through the data conversion circuit 1120-2 or the gamma correction circuit 1120-3 to the display module 1400.

Some of the components may be connected to each other through communication method such as a bus, general purpose input/output (GPIO), serial peripheral interface (SPI), mobile industry processor interface (MIPI), or ultra path interconnect (UPI) link between peripheral devices to exchange signals (e.g., commands or data) with each other. For example, any one of the above-described communication methods may be used, and is not limited to the above-described communication method.

The inventive concepts may be applied to any electronic device including the display device. For example, the inventive concepts may be applied to a television (TV), a digital TV, a 3D TV, a mobile phone, a smart phone, a tablet computer, a virtual reality (VR) device, a wearable electronic device, a personal computer (PC), a home appliance, a laptop computer, a personal digital assistant (PDA), a portable multimedia player (PMP), a digital camera, a music player, a portable game console, a navigation device, etc.

The foregoing is illustrative of the present inventive concept and is not to be construed as limiting thereof. Although a few exemplary embodiments of the present inventive concept have been described, those skilled in the art will readily appreciate that many modifications are possible in the exemplary embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of the present inventive concept and is not to be construed as limited to the specific exemplary embodiments disclosed, and that modifications to the disclosed exemplary embodiments, as well as other exemplary embodiments, are intended to be included within the scope of the appended claims. The present inventive concept is defined by the following claims, with equivalents of the claims to be included therein.

What is claimed is:

1. A display device comprising:
a display panel, the display panel including:
sub-pixels including first sub-pixels configured to display a first color, second sub-pixels configured to display a second color, and third sub-pixels configured to display a third color,
first data lines including first color data lines connected to the first sub-pixels, second color data lines connected to the second sub-pixels, and third color data lines connected to the third sub-pixels,
a display region including a first display region, a second display region disposed adjacent to the first display region, and a third display region disposed adjacent to the second display region, and
fan out lines including first fan out lines connected to first data lines connected to sub-pixels disposed in the first display region, second fan out lines connected to first data lines connected to sub-pixels disposed in the second display region and alternately arranged with the first fan out lines in a peripheral region, and third fan out lines connected to first data lines connected to sub-pixels disposed in the third display region;
a data driver configured to output data voltages to the first fan out lines and the second fan out lines connected to the first data lines in a first arrangement according to the first arrangement, and output data voltages to the third fan out lines connected to the first data lines in a second arrangement according to the second arrangement; and
a timing controller configured to remap input image data based on the first arrangement and the second arrangement, and to control the data driver,
wherein an order of colors of data voltages supplied to the fan out lines in the peripheral region is different from an order of colors of data voltages supplied to the first data lines in the display region.

2. The display device of claim 1, wherein at least one of the first color data lines and the third color data lines is connected to sub-pixels disposed on a first side and a second side which opposes the first side of the at least one of the first color data lines and the third color data lines.

3. The display device of claim 1, wherein the display panel further includes:
a second data line disposed adjacent to a first data line disposed on an outmost portion of the first data lines and connected to one of the first sub-pixels.

4. The display device of claim 3, wherein each of the first data lines is connected to sub-pixels disposed on a first side of the each of the first data lines.

5. The display device of claim 3, wherein the fan out lines further include a fourth fan out line connected to the second data line,
wherein the data driver includes:
first output pads configured to output data voltages to the first fan out lines and the second fan out lines; and
second output pads configured to output data voltages to the third fan out lines; and
first dummy pads disposed between the first output pads and the second output pads.

6. The display device of claim 5, wherein one of the first dummy pads determined according to the first arrangement is configured to output a data voltage to the fourth fan out line.

7. The display device of claim 6, wherein a number of the first dummy pads is a number of colors constituting the first arrangement.

8. The display device of claim 5, wherein one of the first dummy pads determined according to the second arrangement is configured to output a data voltage to the fourth fan out line.

9. The display device of claim 8, wherein a number of first dummy pads is the same as a number of sub-pixels constituting the second arrangement.

10. The display device of claim 5, wherein the fourth fan out line is disposed adjacent to the third fan out line disposed adjacent to the second display region.

11. The display device of claim 10, wherein the first dummy pads are disposed between the second output pads and a first output pads disposed on a first side of the display region, and
wherein the data driver further includes second dummy pads disposed between the second output pads and a first output pads disposed on a second side of the display region.

12. The display device of claim 5, wherein the data driver further includes:
output amplifiers respectively connected to output pads among the first output pads, the second output pads, and the first dummy pads.

13. The display device of claim 5, wherein the data driver further includes:
output amplifiers respectively connected to at least two of output pads among the first output pads, the second output pads, and the first dummy pads.

14. A data driver for outputting data voltages to a display panel which includes first data lines including first color data lines connected to first sub-pixels configured to display a first color, second color data lines connected to second sub-pixels configured to display a second color, and third color data lines connected to third sub-pixels configured to display a third color, and fan out lines including first fan out lines connected to first data lines connected to sub-pixels disposed in a first display region of the display panel, second fan out lines connected to first data lines connected to sub-pixels disposed in a second display region of the display panel disposed adjacent to the first display region, and third fan out lines connected to first data lines connected to sub-pixels disposed in a third display region of the display panel disposed adjacent to the second display region, the data driver comprising:
first output pads configured to output data voltages to the first fan-out lines and the second fan-out lines connected to respective first data lines in a first arrangement according to the first arrangement; and
second output pads configured to output data voltages to the third fan out lines connected to respective first data lines in a second arrangement according to the second arrangement,
wherein an order of colors of data voltages supplied to the fan out lines in a peripheral region is different from an order of colors of data voltages supplied to the first data lines in the first display region, the second display region and the third display region.

15. The data driver of claim 14, further comprising:
a plurality of first dummy pads,
wherein one of the first dummy pads determined according to the first arrangement is configured to output a data voltage to a fourth fan out line connected to a second data line which is disposed outside of the first data lines and connected to one of the first sub-pixels.

16. The data driver of claim 15, wherein a number of the first dummy pads is the same as a number of sub-pixels constituting the first arrangement.

17. An electronic device comprising:
a display module;
a main processor configured to output input image data to a sub processor; and
the sub processor configured to control the display module, wherein the display module includes:
a display panel including sub-pixels which includes first sub-pixels configured to display a first color, second sub-pixels configured to display a second color, and third sub-pixels configured to display a third color, first data lines including first color data lines connected to the first sub-pixels, second color data lines connected to the second sub-pixels, and third color data lines connected to the third sub-pixels, a display region including a first display region, a second display region disposed adjacent to the first display region, and a third display region disposed adjacent to the second display region, fan out lines including first fan out lines connected to first data lines connected to sub-pixels disposed in the first display region, second fan out lines connected to first data lines connected to sub-pixels disposed in the second display region and alternately arranged with the first fan out lines in a peripheral region, and third fan out lines connected to first data lines connected to sub-pixels disposed in the third display region, and a data driver configured to output data voltages to the first fan out lines and the second fan out lines connected to the first data lines in a first arrangement according to the first arrangement, and output data voltages to the third fan out lines connected to the first data lines in a second arrangement according to the second arrangement,
wherein the sub processor is configured to remap the input image data based on the first arrangement and the second arrangement, and
wherein an order of colors of data voltages supplied to the fan out lines in the peripheral region is different from an order of colors of data voltages supplied to the first data lines in the display region.

18. The electronic device of claim 17, wherein at least one of the first color data lines and the third color data lines is connected to sub-pixels disposed on a first side and a second side which opposes the first side of the at least one of the first color data lines and the third color data lines.

19. The electronic device of claim 17, wherein the display panel further includes:
a second data line disposed adjacent to a first data line disposed on outmost portion of the first data lines and connected to one of the first sub-pixels.

20. The electronic device of claim 19, wherein the fan out lines further include a fourth fan out line connected to the second data line,
wherein the data driver includes:
first output pads configured to output data voltages to the first fan out lines and the second fan out lines; and
second output pads configured to output data voltages to the third fan out lines; and
first dummy pads disposed between the first output pads and the second output pads, and
wherein one of the first dummy pads determined according to the first arrangement is configured to output a data voltage to the fourth fan out line.

* * * * *